(12) United States Patent
Kim et al.

(10) Patent No.: US 11,735,663 B2
(45) Date of Patent: Aug. 22, 2023

(54) SEMICONDUCTOR DEVICE AND METHOD FOR FABRICATING THE SAME

(71) Applicant: Samsung Electronics Co., Ltd., Suwon-si (KR)

(72) Inventors: Jin Bum Kim, Seoul (KR); Gyeom Kim, Hwaseong-si (KR); Da Hye Kim, Yongin-si (KR); Jae Mun Kim, Seoul (KR); Il Gyou Shin, Seoul (KR); Seung Hun Lee, Hwaseong-si (KR); Kyung In Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/565,650

(22) Filed: Dec. 30, 2021

(65) Prior Publication Data
US 2022/0123145 A1    Apr. 21, 2022

Related U.S. Application Data

(63) Continuation of application No. 16/910,819, filed on Jun. 24, 2020, now Pat. No. 11,233,150.

(30) Foreign Application Priority Data

Oct. 1, 2019    (KR) .................. 10-2019-0121379

(51) Int. Cl.
| | | |
|---|---|---|
| H01L 29/78 | (2006.01) |
| H01L 29/06 | (2006.01) |
| H01L 29/423 | (2006.01) |
| H01L 29/786 | (2006.01) |
| H01L 29/66 | (2006.01) |
| H01L 21/02 | (2006.01) |

(52) U.S. Cl.
CPC .... *H01L 29/7849* (2013.01); *H01L 21/02236* (2013.01); *H01L 21/02532* (2013.01); *H01L 21/02603* (2013.01); *H01L 29/0673* (2013.01); *H01L 29/42392* (2013.01); *H01L 29/66742* (2013.01); *H01L 29/66795* (2013.01); *H01L 29/785* (2013.01); *H01L 29/78696* (2013.01)

(58) Field of Classification Search
CPC ............ H01L 29/66795; H01L 29/785; H01L 29/0673; H01L 21/02532; H01L 21/02236; H01L 29/7849
See application file for complete search history.

(56) References Cited

U.S. PATENT DOCUMENTS

| | | |
|---|---|---|
| 7,560,326 B2 | 7/2009 | Mocuta et al. |
| 7,948,008 B2 | 5/2011 | Liu et al. |
| 9,385,233 B2 | 7/2016 | Akarvardar et al. |
| 9,515,185 B2 | 12/2016 | Liu et al. |
| 9,520,498 B2 | 12/2016 | Ching et al. |

(Continued)

*Primary Examiner* — Changhyun Yi
(74) *Attorney, Agent, or Firm* — Harness, Dickey & Pierce, P.L.C.

(57) ABSTRACT

Example semiconductor devices and methods for fabricating a semiconductor device are disclosed. An example device may include a substrate, a first semiconductor pattern spaced apart from the substrate, a first antioxidant pattern extending along a bottom surface of the first semiconductor pattern and spaced apart from the substrate, and a field insulating film on the substrate. The insulating film may cover at least a part of a side wall of the first semiconductor pattern. The first antioxidant pattern may include a first semiconductor material film doped with a first impurity.

20 Claims, 36 Drawing Sheets

(56) References Cited

U.S. PATENT DOCUMENTS

| | | |
|---|---|---|
| 9,711,535 B2 | 7/2017 | Wang et al. |
| 9,780,214 B2 | 10/2017 | Huang et al. |
| 2015/0263159 A1 | 9/2015 | Ching et al. |
| 2017/0373190 A1 | 12/2017 | Lee et al. |

SEMICONDUCTOR DEVICE AND METHOD FOR FABRICATING THE SAME

This application is a continuation of U.S. application Ser. No. 16/910,819, filed Jun. 24, 2020, which claims priority under 35 U.S.C. § 119 to Korean Patent Application No. 10-2019-0121379 filed Oct. 1, 2019, the disclosure of each of which is incorporated herein in its entirety by reference.

BACKGROUND

1. Technical Field

Inventive concepts relate to a semiconductor device and/or a method for fabricating the same.

2. Description of Related Art

As one of scaling technologies for increasing a density of a semiconductor device, a multi-gate transistor, in which a fin-shaped silicon body is formed on a substrate and a gate is formed on a surface of the silicon body, has been proposed.

Since such a multi-gate transistor uses a three-dimensional channel, it is easy to perform scaling. Further, even if a gate length of the multi-gate transistor is not increased, the current control capability can be improved. In addition, it is possible to effectively limit and/or suppress a short channel effect (SCE) in which the potential of a channel region is affected by a drain voltage.

Recently, a technique which forms a layer containing a stress material in a fin-shaped silicon body to increase the carrier mobility of the channel region of the semiconductor device has also been used.

SUMMARY

Aspects of inventive concepts provide a semiconductor device with improved operating characteristics and reliability.

Aspects of inventive concepts also provide a method for fabricating a semiconductor device with improved operating characteristics and reliability.

According to some aspects of inventive concepts, a semiconductor device includes a substrate; a first semiconductor pattern spaced apart from the substrate; a first antioxidant pattern extending along a bottom surface of the first semiconductor pattern and spaced apart from the substrate, the first antioxidant pattern including a first semiconductor material film doped with a first impurity; and a field insulating film on the substrate. The field insulating film may cover at least a part of a side wall of the first semiconductor pattern.

According to some aspects of inventive concepts, a semiconductor device includes a substrate; a first semiconductor pattern spaced apart from the substrate; a field insulating film on the substrate and covering at least a part of a side wall of the first semiconductor pattern; and a fin liner. The field insulating film may include a filling insulating film and a stress insulating film, the stress insulating film including an oxide containing germanium. The fin liner may extend along at least a part of the side wall of the first semiconductor pattern and may extend between the field insulating film and the first semiconductor pattern. The fin liner may be arranged so the fin liner is not in contact with the substrate.

According to some aspects of inventive concepts, a semiconductor device includes a substrate; a protruding pattern protruding from the substrate; a first semiconductor pattern spaced apart from the protruding pattern; a first antioxidant pattern contacting the first semiconductor pattern and extending along a bottom surface of the first semiconductor pattern; a field insulating film on the substrate; and a gate electrode. The first antioxidant pattern may extend between the protruding pattern and the first semiconductor pattern. The first antioxidant pattern may include a first semiconductor material film undoped and a second semiconductor material film being doped with a first impurity. The field insulating film may cover the protruding pattern and may cover at least a part of a side wall of the first semiconductor pattern. The gate electrode may intersect the first semiconductor pattern on the field insulating film.

According to some aspects of inventive concepts, a method for fabricating a semiconductor device may include forming a sacrificial film is on a substrate; forming a first antioxidant film on the sacrificial film; forming a semiconductor film on the first antioxidant film; forming a fin trench in the semiconductor film, the first antioxidant film, and the sacrificial film to form a semiconductor pattern, a first antioxidant pattern, and a sacrificial pattern on the substrate; forming a pre-field insulating film in the fin trench, the pre-field insulating film covering at least a part of a side wall of the sacrificial pattern; forming a first field insulating film through a densification process of the pre-field insulating film; and oxidizing the sacrificial pattern to form a stress insulating film. The oxidizing the sacrificial pattern may be performed during the densification process.

According to some aspects of inventive concepts, a method for fabricating a semiconductor device may include forming a sacrificial film is formed on a substrate; forming a first antioxidant film on the sacrificial film; forming a semiconductor film on the first antioxidant film; forming a fin trench in the semiconductor film, the first antioxidant film and the sacrificial film to form a semiconductor pattern, a first antioxidant pattern and a sacrificial pattern on the substrate; forming a pre-field insulating film for covering at least a part of a side wall of the sacrificial pattern, in the fin trench; forming a first field insulating film through a densification process of the pre-field insulating film; and oxidizing the sacrificial pattern to form a stress insulating film during execution of the densification process.

However, aspects of inventive concepts are not restricted to the one set forth herein. The above and other aspects of inventive concepts will become more apparent to one of ordinary skill by referencing the detailed description of inventive concepts given below.

BRIEF DESCRIPTION OF THE DRAWINGS

The above and other aspects and features of inventive concepts will become more apparent by describing in detail example embodiments thereof with reference to the attached drawings, in which.

DETAILED DESCRIPTION

Figure 1:
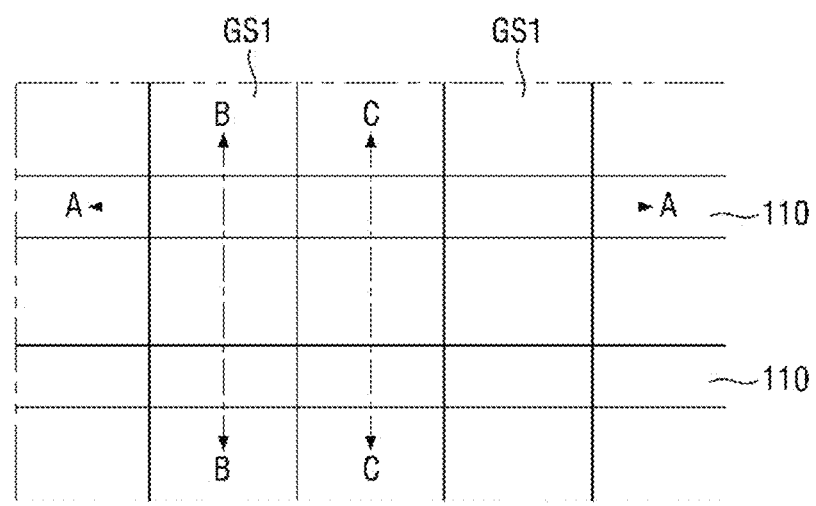
FIG. 1 is a schematic layout diagram for explaining a semiconductor device according to some embodiments.
Figure 1:
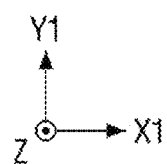

In the drawings of the semiconductor device according to some embodiments, a fin type transistor (FinFET) including a channel region of a fin-shaped pattern shape is shown as a non-limiting example. Also, in the drawings of the semiconductor device according to some embodiments, although a transistor including a nanowire or a nanosheet is shown, inventive concepts are not limited thereto. The semiconductor device according to some embodiments may, of course, include a tunneling transistor (FET), a vertical transistor or a three-dimensional (3D) transistor. The semiconductor device according to some embodiments may include a bipolar junction transistor, a lateral double diffusion transistor (LDMOS), and the like.

A semiconductor device according to some embodiments will be described with reference to FIGS. 1 to 6.

Figure 2:
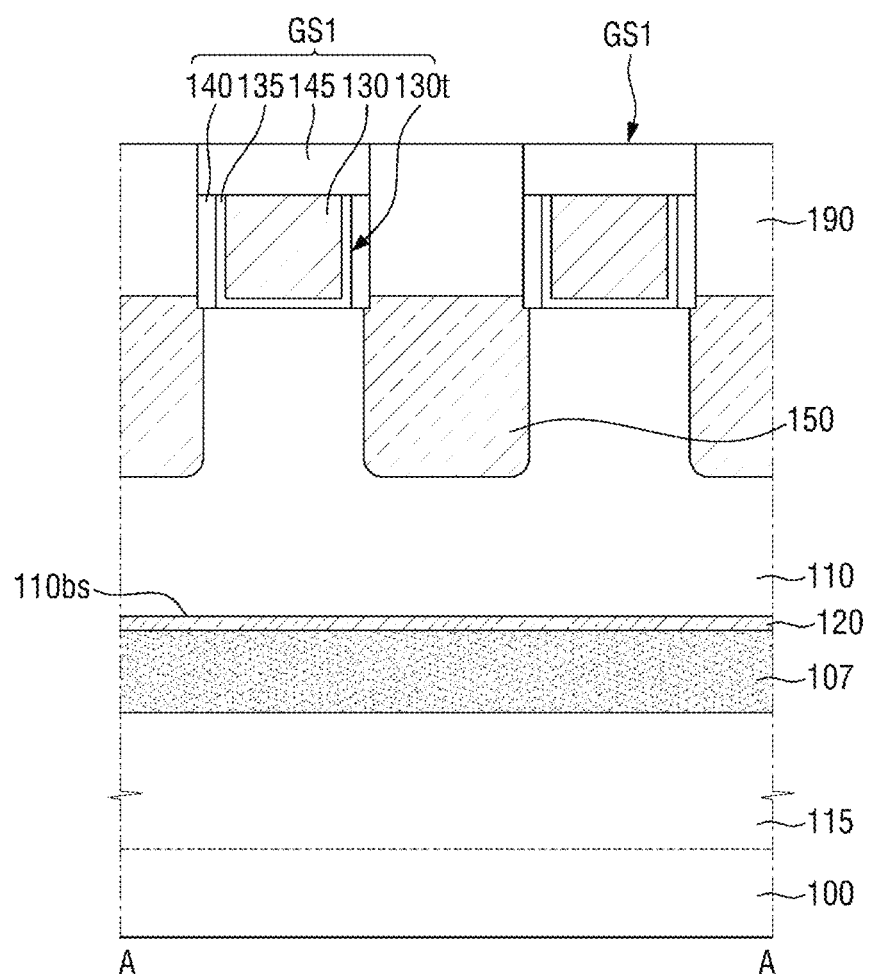
FIGS. 2 to 4 are cross-sectional views taken along lines A-A, B-B, and C-C of FIG. 1, respectively.
Figure 3:
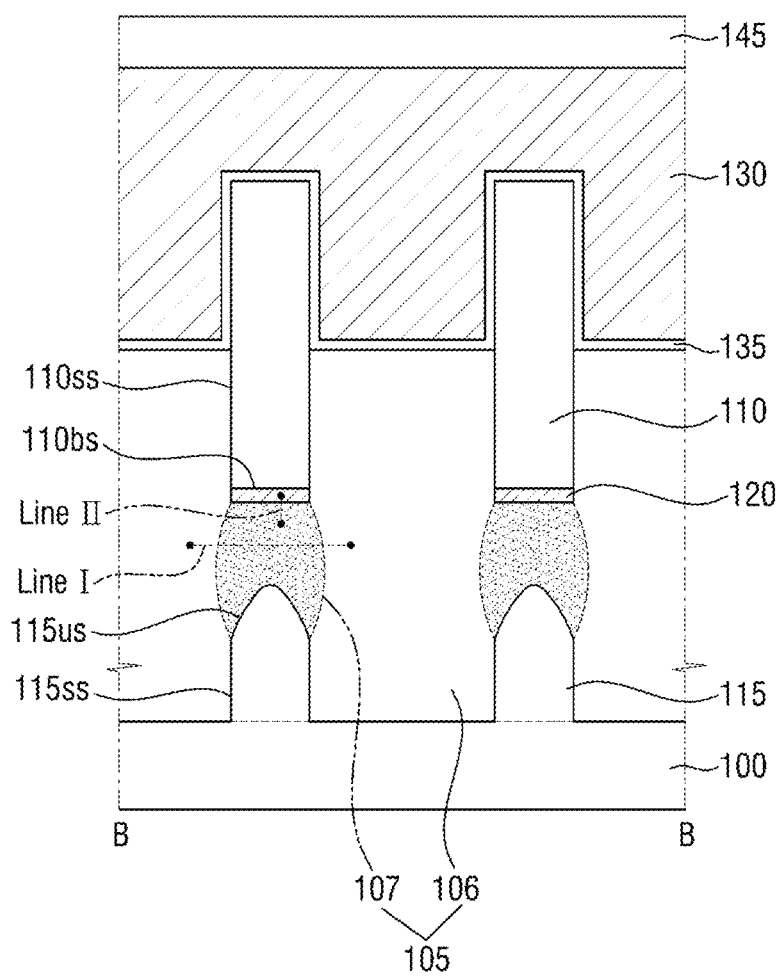
Figure 4:
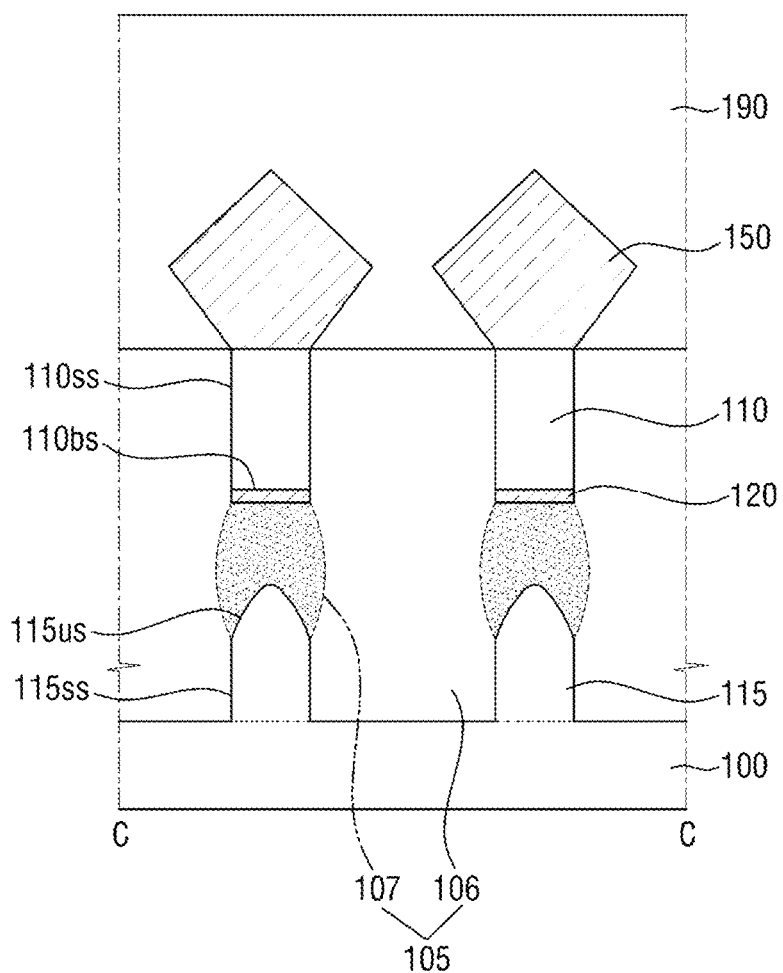
Figure 5:
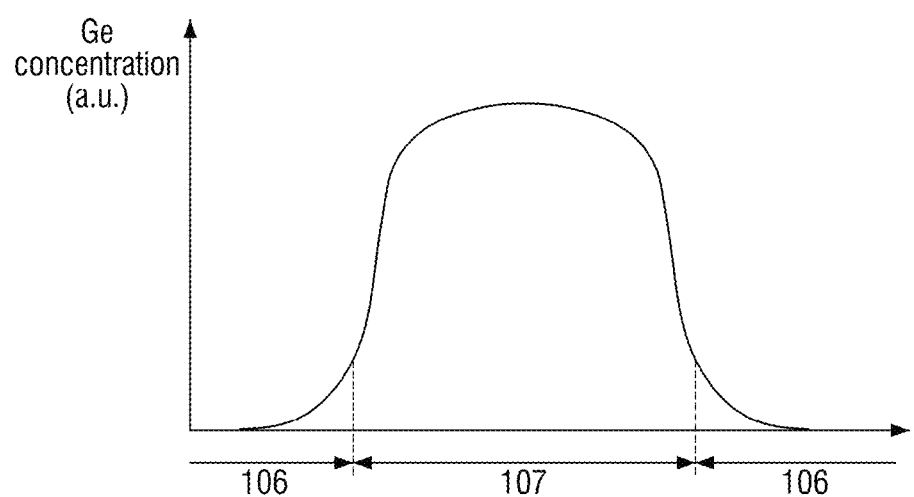
FIG. 5 is a schematic graph showing a concentration of germanium along a Line I of FIG. 3.
Figure 6:
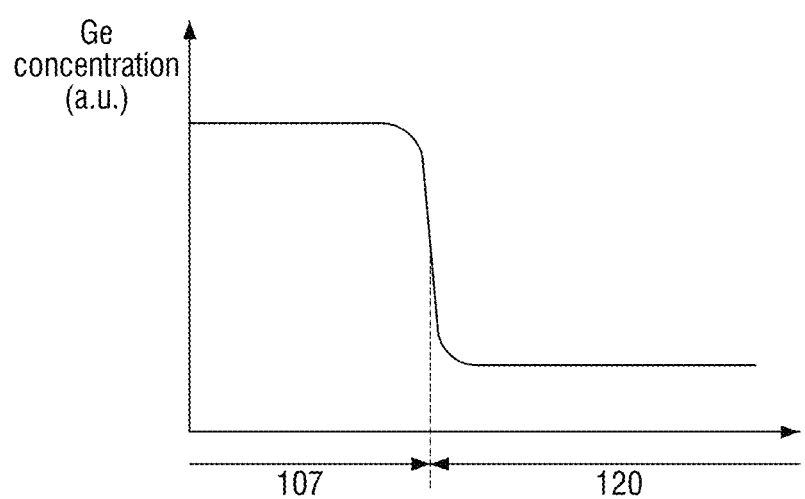
FIG. 6 is a schematic graph showing the concentration of germanium along a Line II of FIG. 3.

FIG. 1 is a schematic layout diagram for explaining a semiconductor device according to some embodiments. FIGS. 2 to 4 are cross-sectional views taken along lines A-A, B-B, and C-C of FIG. 1, respectively. FIG. 5 is a schematic graph showing the concentration of germanium along a Line I of FIG. 3. FIG. 6 is a schematic graph showing the concentration of germanium along a Line II of FIG. 3.

For reference, FIG. 6 is a diagram showing a case where a first antioxidant pattern 120 includes a silicon germanium semiconductor pattern.

Referring to FIGS. 1 to 6, the semiconductor device according to some embodiments may include a first channel semiconductor pattern 110, a first field insulating film 105, a first antioxidant pattern 120 and a first gate structure GS1.

The substrate 100 may be a silicon substrate or may include, but is not limited to, other materials, for example, SOI (silicon-on-insulator), silicon germanium, SGOI (silicon germanium on insulator), indium antimonide, lead tellurium compound, indium arsenide, indium phosphide, gallium arsenide or gallium antimonide.

A fin type protruding pattern 115 may protrude from the substrate 100. The fin type protruding pattern 115 may extend long along a first direction X1. The fin type protruding patterns 115 adjacent to each other may be spaced apart in a second direction Y1.

In the semiconductor device according to some embodiments, an upper part of the fin type protruding pattern 115 may have a triangular shape. For example, an upper surface 115us of the fin type protruding pattern may be defined by joining of inclined surfaces having an inclination different from that of a side wall 115ss of the fin type protruding pattern. The upper surface 115us of the fin type protruding pattern may be pointed out in a third direction Z.

The fin type protruding pattern 115 may be formed by etching a part of the substrate 100, and may include an epitaxial layer grown from the substrate 100.

The fin type protruding pattern 115 may include silicon or germanium, which is an elemental semiconductor material. In addition, the fin type protruding pattern 115 may include a compound semiconductor, and may include, for example, a group IV-IV compound semiconductor or a group III-V compound semiconductor.

The group IV-IV compound semiconductors may be, for example, a binary compound and a ternary compound containing at least two or more of carbon (C), silicon (Si), germanium (Ge), and tin (Sn) or a compound obtained by doping these elements with a group IV element. The group III-V compound semiconductor may be, for example, one of a binary compound, a ternary compound or a quaternary compound formed by coupling at least one of aluminum (Al), gallium (Ga) and indium (In) as a group III element and at least one of phosphorus (P), arsenic (As) and antimony (Sb) as a group V element.

In the semiconductor device according to some embodiments, the fin type protruding pattern 115 may be a silicon semiconductor pattern or a silicon germanium semiconductor pattern.

The first channel semiconductor pattern 110 may be spaced apart from the substrate 100 in the third direction Z. The first channel semiconductor pattern 110 may be disposed on the fin type protruding pattern 115. The first channel semiconductor pattern 110 may be spaced apart from the fin type protruding pattern 115 in the third direction Z. The first channel semiconductor pattern 110 may extend long in the first direction X1 along the fin type protruding pattern 115.

The first channel semiconductor pattern 110 may include silicon or germanium, which is an elemental semiconductor material. In addition, the first channel semiconductor pattern 110 may include a compound semiconductor, for example, an IV-IV group compound semiconductor or a III-V group compound semiconductor.

In the semiconductor device according to some embodiments, the first channel semiconductor pattern 110 may include at least one of a silicon semiconductor pattern or a silicon germanium semiconductor pattern.

In the semiconductor device according to some embodiments, the first channel semiconductor pattern 110 may be a fin type semiconductor pattern.

The first antioxidant pattern 120 may be disposed between the first channel semiconductor pattern 110 and the fin type protruding pattern 115. The first antioxidant pattern 120 may be in direct contact with the first channel semiconductor pattern 110.

The first antioxidant pattern 120 may extend along a bottom surface 110bs of the first channel semiconductor pattern. The first antioxidant pattern 120 may be in direct contact with the bottom surface of the first channel semiconductor pattern 110.

The first antioxidant pattern 120 may be disposed to be spaced apart from the substrate 100. Also, the first antioxidant pattern 120 may be disposed to be spaced apart from the fin type protruding pattern 115. On the basis of (e.g., relative to) the upper surface of the substrate 100, a height to an uppermost part of the fin type protruding pattern 115 is smaller than a height to a lowermost part of the first antioxidant pattern 120.

The first antioxidant pattern 120 may include a semiconductor material film. The semiconductor material film may be a semiconductor pattern grown through an epitaxial process. The first antioxidant pattern 120 may include, for example, at least one of silicon or silicon germanium. That is, the first antioxidant pattern 120 may include at least one of a silicon semiconductor pattern or a silicon germanium semiconductor pattern.

The first antioxidant pattern 120 may include a doped first impurity. The first antioxidant pattern 120 may be a semiconductor material film including a doped first impurity.

The first impurity doped in the first antioxidant pattern 120 may be an oxidation-inhibiting impurity that limits and/or suppresses the oxidation of the first channel semiconductor pattern 110. The first impurity doped in the first antioxidant pattern 120 may include, for example, at least one of oxygen (O), nitrogen (N), and carbon (C).

The semiconductor material film included in the first antioxidant pattern 120 may include a first impurity to the extent that a lattice structure (e.g., a diamond structure or a zinc blend structure) of the semiconductor material film is not broken. For example, the first antioxidant pattern 120 may have a diamond structure or a zinc blend structure.

The first field insulating film 105 may be disposed on the substrate 100. The first field insulating film 105 may cover the fin type protruding pattern 115.

The first field insulating film 105 may be disposed between the fin type protruding pattern 115 and the first channel semiconductor pattern 110 spaced apart from each other in the third direction Z. The first field insulating film 105 may also be disposed between the adjacent fin type protruding patterns 115 and between the adjacent first channel semiconductor patterns 110.

The first field insulating film 105 is disposed between the first antioxidant pattern 120 and the fin type protruding pattern 115, and the first antioxidant pattern 120 may be spaced apart from the fin type protruding pattern 115 in the third direction Z.

The first antioxidant pattern 120 includes a first surface facing the bottom surface 110bs of the first channel semiconductor pattern, and a second surface opposite to the first surface. The second surface of the first antioxidant pattern 120 may be in direct contact with the first field insulating film 105.

For example, the first field insulating film 105 may cover at least a part of a side wall 110ss of the first channel semiconductor pattern. In the semiconductor device according to some embodiments, the first field insulating film 105 may cover a part of the side wall 110ss of the first channel semiconductor pattern.

A part of the first channel semiconductor pattern 110 may protrude upward from the upper surface of the first field insulating film 105.

The first field insulating film 105 may include a filling insulating film 106 and a stress insulating film 107.

The stress insulating film 107 may be disposed between the first antioxidant pattern 120 and the fin type protruding pattern 115 spaced apart from each other in the third direction. The stress insulating film 107, the first antioxidant pattern 120, and the first channel semiconductor pattern 110 may be sequentially disposed on the fin type protruding pattern 115. The first antioxidant pattern 120 may be disposed at a position which overlaps the stress insulating film 107 in the third direction Z.

The respective stress insulating films 107 formed between the first antioxidant pattern 120 and the fin type protruding pattern 115 may be formed to be spaced apart from each other in the second direction Y1. The stress insulating film 107 may be in contact with the second surface of the first antioxidant pattern 120. The stress insulating film 107 may cover the upper surface 115us of the triangular fin-shaped protruding pattern 115.

The filling insulating film 106 may be disposed between the adjacent fin type protruding patterns 115. The filling insulating film 106 may be disposed between the adjacent first channel semiconductor patterns 110. The filling insulating film 106 may cover at least a part of the side wall 110ss of the first channel semiconductor pattern. The stress insulating film 107 does not cover the side wall 110ss of the first channel semiconductor pattern 110.

The filling insulating film 106 may cover the side wall 115ss of the fin type protruding pattern. The filling insulating film 106 may be disposed between the stress insulating films 107 formed to be spaced apart from each other in the second direction Y1.

The filling insulating film 106 may include, for example, at least one of a silicon oxide film, a silicon nitride film, and a silicon oxynitride film.

The stress insulating film 107 may include, for example, an oxide containing germanium. In FIG. 5, the concentration of germanium in the stress insulating film 107 is higher than the concentration of germanium of the filling insulating film 106. The filling insulating film 106 may include germanium diffused from the stress insulating film 107. The concentration of germanium may change rapidly between the filling insulating film 106 and the stress insulating film 107.

For example, the stress insulating film 107 may include at least one of germanium oxide and silicon germanium oxide.

In FIG. 6, when the first antioxidant pattern 120 is a silicon germanium semiconductor pattern doped with the first impurity, the concentration (/cm$^3$) of germanium in the stress insulating film 107 is higher than the concentration of germanium in the first antioxidant pattern 120. The concentration of germanium in the first antioxidant pattern 120 may be related to the germanium fraction in silicon germanium.

A part of the first antioxidant pattern 120 may also be oxidized during formation of the stress insulating film 107. In such a case, the doped first impurity that has escaped from the lattice structure while the first antioxidant pattern 120 is oxidized may be gathered in the vicinity of a boundary between the first antioxidant pattern 120 and the stress insulating film 107.

That is, in the vicinity of the boundary between the first antioxidant pattern 120 and the stress insulating film 107, the stress insulating film 107 may contain the first impurity (e.g., nitrogen or carbon). However, if the first impurity is oxygen (O), since the stress insulating film 107 is also an oxide, it may not be confirmed whether the stress insulating film 107 contains the first impurity.

The first impurity doped in the first antioxidant pattern 120 may limit and/or suppress movement of the Si—O coupling included in the stress insulating film 107 into the channel semiconductor pattern 110 through an interstitial site diffusion. The first antioxidant pattern 120 may limit and/or prevent the first channel semiconductor pattern 110 from being oxidized.

Alternatively, the first impurity doped in the first antioxidant pattern 120 may limit and/or suppress the germanium in the sacrificial pattern (107p of FIG. 30) before the stress insulating film 107 is formed from moving into the first channel semiconductor pattern 110. The first antioxidant pattern 120 may limit and/or prevent the germanium from moving to the first channel semiconductor pattern 110, thereby limiting and/or preventing the first channel semiconductor pattern 110 from being oxidized during formation of the stress insulating film 107.

The first gate structure GS1 may extend in the second direction Y1 and intersect the first channel semiconductor pattern 110. The first gate structure GS1 may be disposed on the first field insulating film 105 and the first channel semiconductor pattern 110.

Although the first gate structure GS1 is shown to intersect simultaneously a plurality of adjacent first channel semiconductor patterns 110, inventive concepts are not limited thereto. That is, it is a matter of course that the two first channel semiconductor patterns 110 shown may intersect the first gate structures GS1 separated from each other.

The first gate structure GS1 may include a first gate electrode 130, a first gate insulating film 135, a first gate spacer 140, and a first capping pattern 145.

The first gate spacer 140 may extend in the second direction Y1. The first gate spacer 140 may define a first gate trench 130t that extends in the second direction Y1.

The first gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon boron oxynitride (SiOBN), silicon oxycarbide (SiOC), and combinations thereof.

The first gate insulating film 135 may extend along the side wall and the bottom surface of the first gate trench 130t. The first gate insulating film 135 may be formed along a profile of the first channel semiconductor pattern 110 protruding upward from the upper surface of the first field insulating film 105, and a profile of the upper surface of the first field insulating film 105.

Although not shown, an interfacial layer may be formed between the first gate insulating film 135 and the first channel semiconductor pattern 110.

The first gate insulating film 135 may include at least one of silicon oxide, silicon oxynitride, silicon nitride or a high dielectric constant material having a dielectric constant higher than that of silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first gate electrode 130 may be formed on the first gate insulating film 135 between the first gate spacers 140. The first gate electrode 130 may cover the first channel semiconductor pattern 110 protruding upward from the upper surface of the first field insulating film 105.

The first gate electrode 130 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first gate electrodes 130 may include a conductive metal oxide, a conductive metal oxynitride or the like, or may include a form in which the above-described materials are oxidized.

The first capping pattern 145 may be disposed on the first gate electrode 130 and the first gate spacer 140. In FIG. 2, although the upper surface of the first gate spacer 140 is shown as being recessed downward from the upper surface of the first interlayer insulating film 190 like the first gate electrode 130, inventive concepts are not limited thereto. The first capping pattern 145 may be disposed between the inner side walls of the first gate spacer 140. In such a case, as an example, the first gate insulating film 135 may extend between the first capping pattern 145 and the first gate spacer 140. As another example, the first gate insulating film 135 may not extend between the first capping pattern 145 and the first gate spacer 140.

The upper surface of the first capping pattern 145 may be placed on the same plane as the upper surface of the first interlayer insulating film 190. The first capping pattern 145 may include, for example, a material having an etching selectivity to the first interlayer insulating film 190.

The first capping pattern 145 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

The first epitaxial pattern 150 may be formed between first gate structures GS1 adjacent to each other. The first epitaxial pattern 150 may be formed in the first channel semiconductor pattern 110. The first epitaxial pattern 150 may be formed through an epitaxial growth process.

The first epitaxial pattern 150 may be included in a source/drain of a transistor that uses the first channel semiconductor pattern 110 as a channel region.

In FIG. 4, although the first epitaxial patterns 150 each formed on the adjacent first channel semiconductor patterns 110 are shown as being separated from each other, inventive concepts are not limited thereto. It is a matter of course that the first epitaxial patterns 150 each formed on the adjacent first channel semiconductor patterns 110 may be connected to each other.

The interlayer insulating film 190 may be formed on the first epitaxial pattern 150. The interlayer insulating film 190 may wrap around the side walls of the first gate structure GS1.

Although it is not shown, the interlayer insulating film 190 may further include an etching stop film that extends along at least a part of the upper surface of the first epitaxial pattern 150.

The interlayer insulating film 190 may include, for example, at least one of silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

Figure 7:
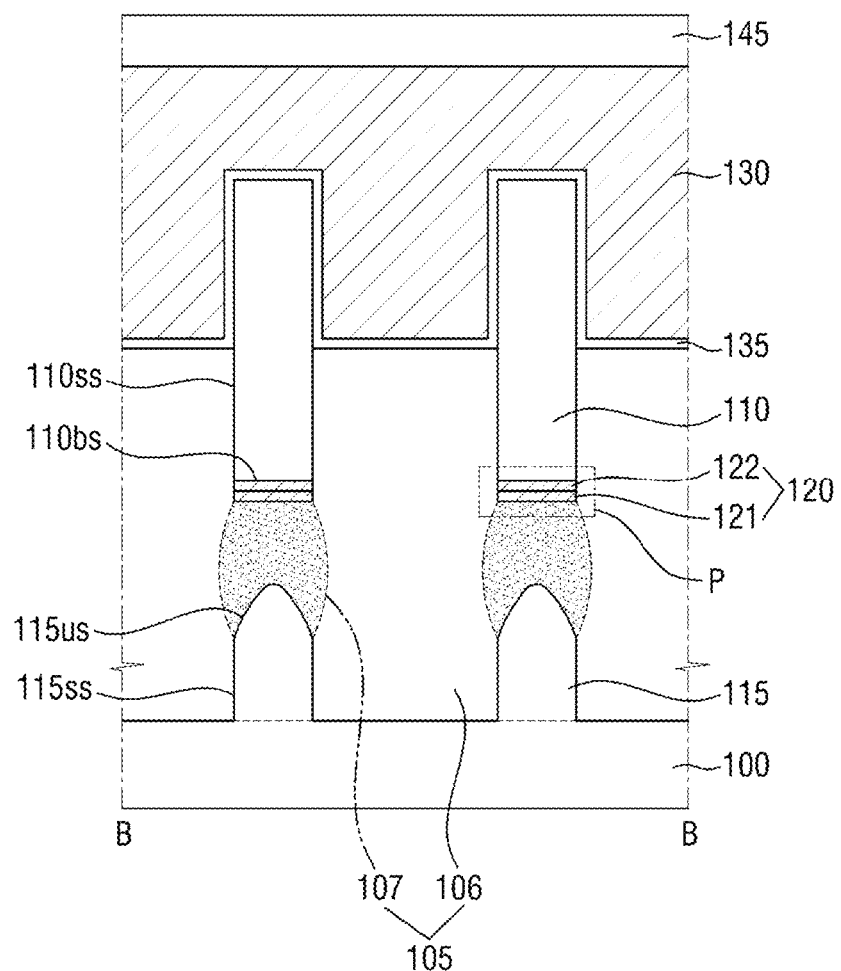
FIG. 7 is a diagram for explaining the semiconductor device according to some embodiments.
Figure 8A:
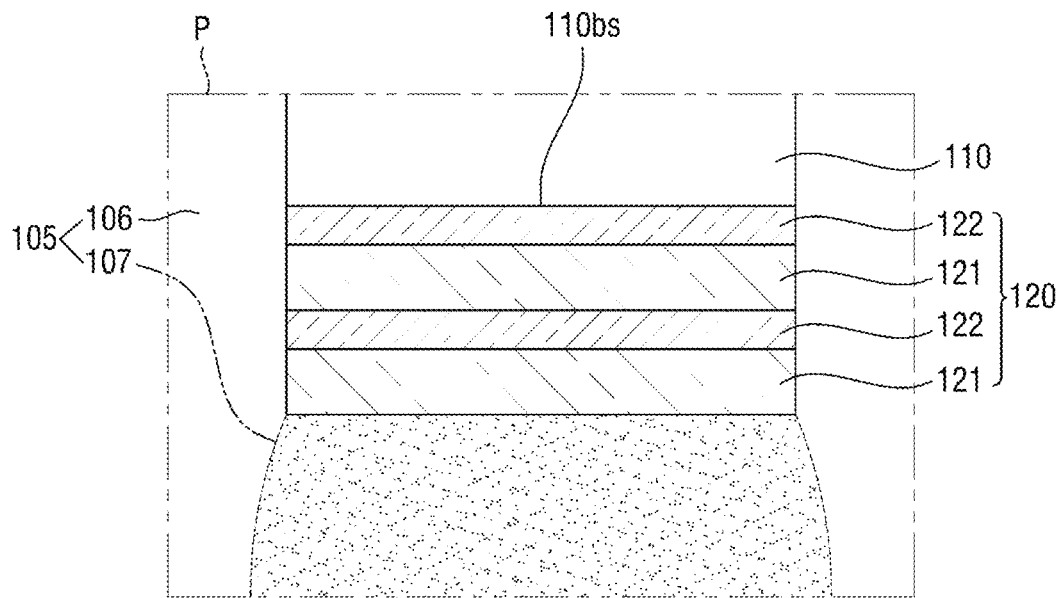
FIGS. 8a and 8b are example views in which a part P of FIG. 7 is enlarged.
Figure 8B:
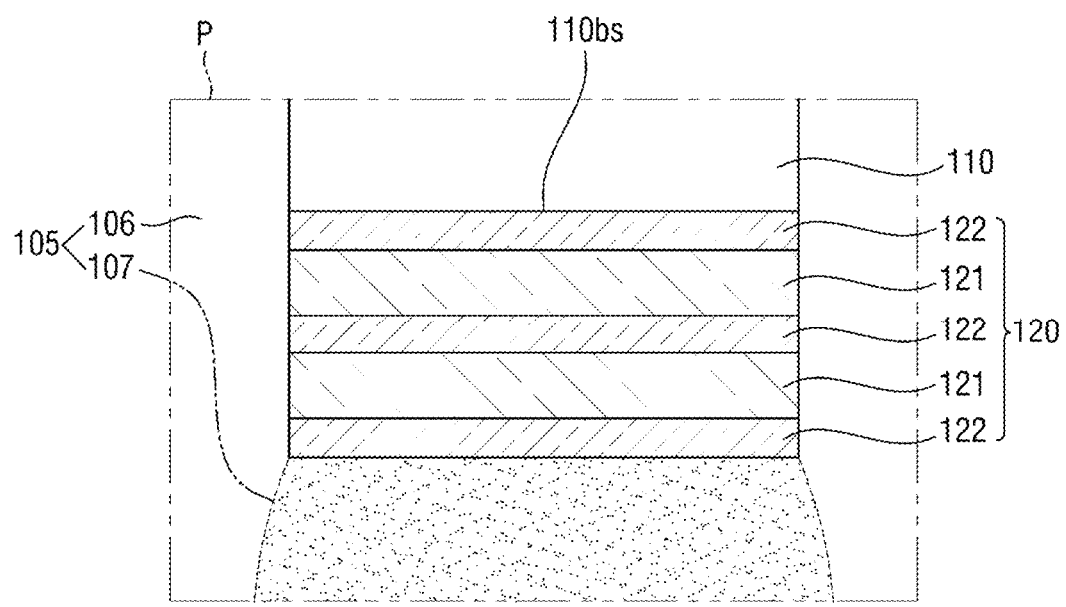

FIG. 7 is a diagram for explaining a semiconductor device according to some embodiments. FIGS. 8*a* and 8*b* are example views in which a part P of FIG. 7 is enlarged. For the convenience of explanation, the explanation will focus on differences from contents explained using FIGS. 1 through 6.

Referring to FIGS. 7 to 8*b*, in a semiconductor device according to some embodiments, the first antioxidant pattern 120 may include a first sub-pattern 121 and a second sub-pattern 122.

The first sub-pattern 121 may be an undoped semiconductor material film. The second sub-pattern 122 may be a semiconductor material film including a doped first impurity. The first sub-pattern 121 may not include artificially doped first impurity. However, the first sub-pattern 121 may include the first impurity diffused from the second sub-pattern 122 at the boundary with the second sub-pattern 122.

The first sub-pattern 121 may include one of a silicon semiconductor pattern or a silicon germanium semiconductor pattern. The second sub-pattern 122 may include one of a silicon semiconductor pattern or a silicon germanium semiconductor pattern.

As an example, the second sub-pattern 122 may be a semiconductor material film including a plurality of layers doped with the first impurity. As another example, the second sub-pattern 122 may be a semiconductor material film of a monolayer with the first impurity treated.

In the semiconductor device according to some embodiments, each of the first sub-pattern 121 and the second sub-pattern 122 may include a silicon semiconductor pattern. For example, the first sub-pattern 121 may be a silicon semiconductor pattern, and the second sub-pattern 122 may be a silicon pattern including a doped first impurity.

The first antioxidant pattern 120 may include a first sub-pattern 121 and a second sub-pattern 122 that are alternately stacked.

In FIG. 8*a*, in the first antioxidant pattern 120, the number of the first sub-patterns 121 may be the same as the number of the second sub-patterns 122. In FIG. 8*b*, in the first antioxidant pattern 120, the number of the second sub-patterns 122 may be one more than the number of the first sub-patterns 121.

In FIGS. 8*a* and 8*b*, although the second sub-pattern 122 is shown as being in direct contact with the bottom surface 110*bs* of the first channel semiconductor pattern, inventive concepts are not limited thereto. The first sub-pattern 121 may be in direct contact with the bottom surface 110*bs* of the first channel semiconductor pattern. In such a case, in FIG. 8*b*, the number of second sub-patterns 122 may be one smaller than the number of first sub-patterns 121.

Further, in FIGS. 8*a* and 8*b*, although each of the numbers of the first sub-pattern 121 and the second sub-pattern 122 is shown by two or more, this is only for convenience of explanation, and the numbers thereof are not limited thereto. That is, it is a matter of course that each of the numbers of the first sub-pattern 121 and the second sub-pattern 122 may be one or more.

Figure 9:
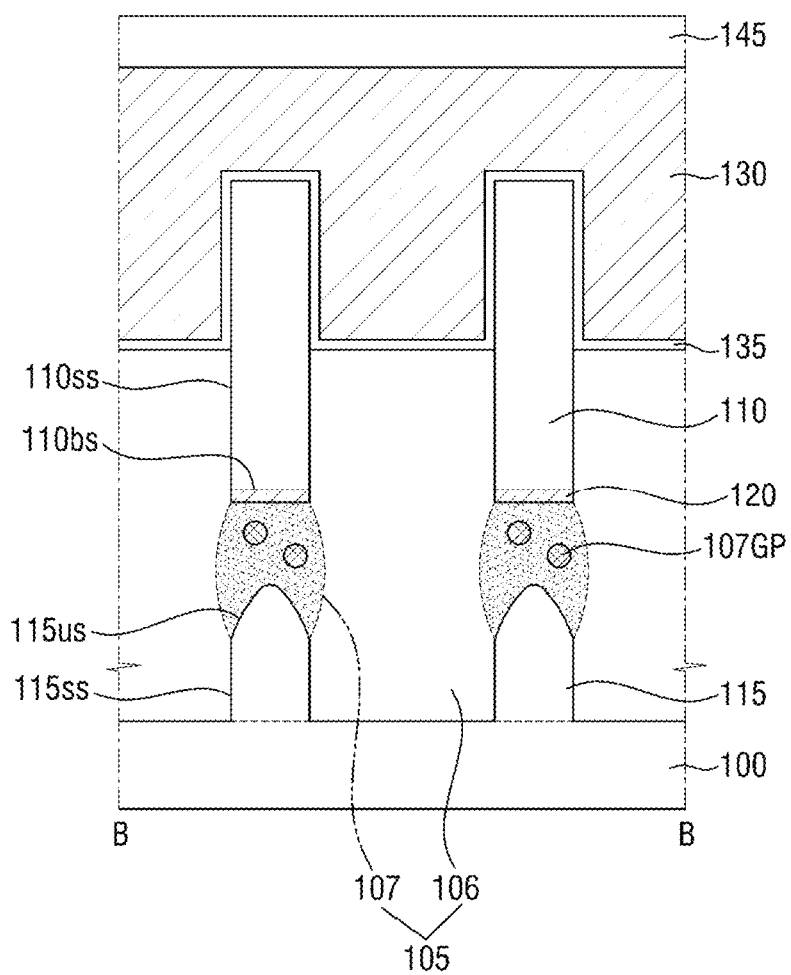
FIG. 9 is a diagram for explaining the semiconductor device according to some embodiments.
Figure 10:
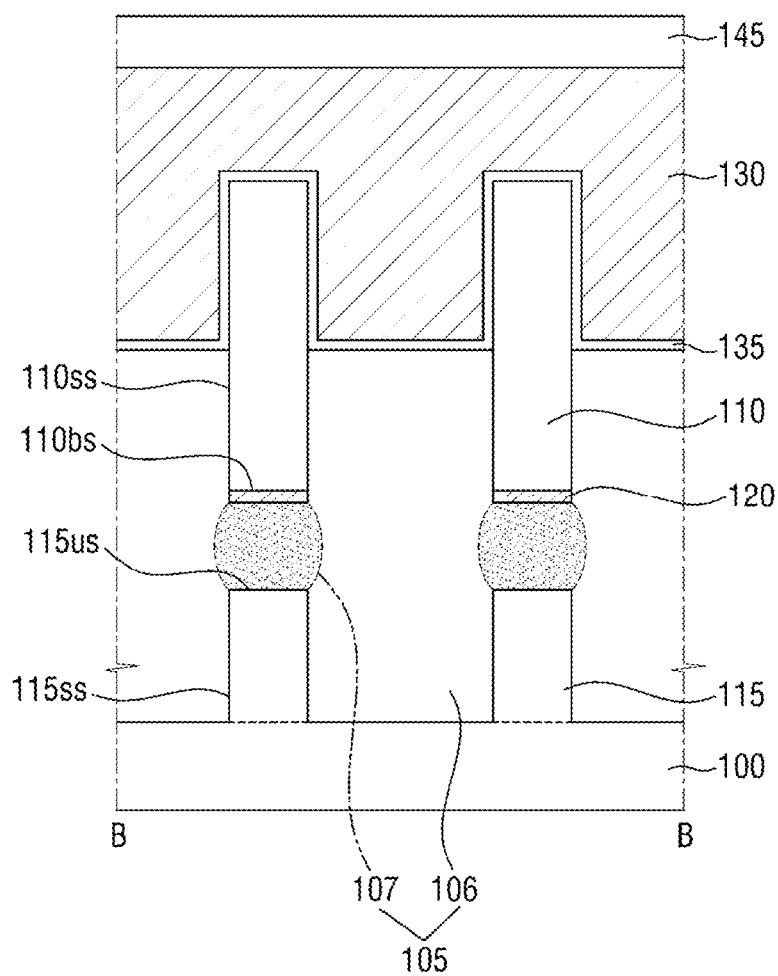
FIG. 10 is a diagram for explaining the semiconductor device according to some embodiments.
Figure 11:
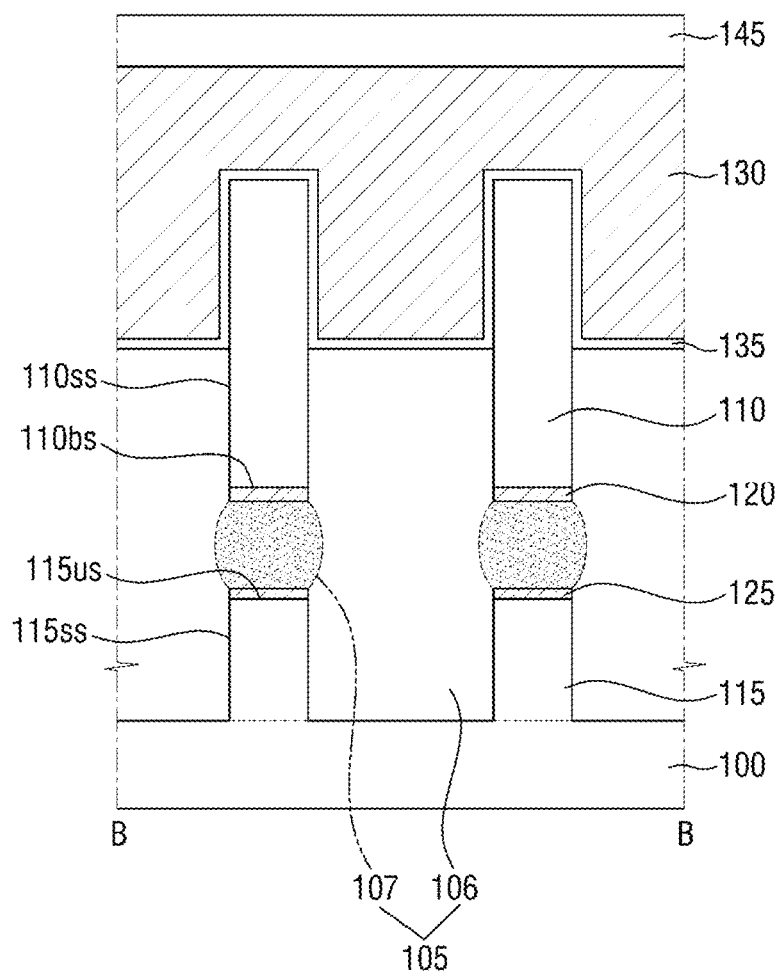
FIG. 11 is a diagram for explaining the semiconductor device according to some embodiments.

FIG. 9 is a diagram for explaining a semiconductor device according to some embodiments. FIG. 10 is a diagram for explaining the semiconductor device according to some embodiments. FIG. 11 is a diagram for explaining a semiconductor device according to some embodiments. For the convenience of explanation, the explanation will focus on the differences from the contents explained using FIGS. 1 through 6.

Referring to FIG. 9, in the semiconductor device according to some embodiments, a germanium deposition pattern 107GP may be formed in the stress insulating film 107.

The germanium deposition pattern 107GP may be formed between the first antioxidant pattern 120 and the fin type protruding pattern 115.

When silicon germanium is oxidized, the oxidation rate of silicon is faster than the oxidation rate of germanium. The stress insulating film 107 may be formed by oxidizing the silicon germanium film. At this time, since silicon is oxidized faster than germanium, germanium having a low oxidation rate may be gathered in a certain region. If all the germanium gathered in a certain region is not oxidized, it may remain as a germanium deposition pattern 107GP (also referred to as germanium precipitation pattern) in the stress insulating film 107.

Referring to FIG. 10, in the semiconductor device according to some embodiments, the upper part of the fin type protruding pattern 115 may have a square shape.

The upper surface 115*us* of the fin type protruding pattern may have a flat surface.

Referring to FIG. 11, the semiconductor device according to some embodiments may further include a second antioxidant pattern 125 extending along the upper surface 115*us* of the fin type protruding pattern.

The second antioxidant pattern 125 may be in direct contact with the fin type protruding pattern 115. The second antioxidant pattern 125 may be spaced apart from the first antioxidant pattern 120 in the third direction Z. A stress insulating film 107 may be disposed between the first antioxidant pattern 120 and the second antioxidant pattern 125.

The second antioxidant pattern 125 may include a semiconductor material film. The second antioxidant pattern 125 may include, for example, at least one of silicon or silicon germanium. That is, the second antioxidant pattern 125 may include at least one of a silicon semiconductor pattern or a silicon germanium semiconductor pattern.

The second antioxidant pattern 125 may include a doped second impurity. The second antioxidant pattern 125 may be a semiconductor material film containing a doped second impurity.

The second impurity doped in the second antioxidant pattern 125 may be an oxidation-inhibiting impurity that inhibits the oxidation of the fin type protruding pattern 115. The second impurity doped in the second antioxidant pattern 125 may include, for example, at least one of oxygen (O), nitrogen (N), and carbon (C). The semiconductor material film included in the second antioxidant pattern 125 may contain a second impurity to the extent that the lattice structure (a diamond structure or a zinc blend structure) of the semiconductor material film is not broken.

Figure 12:
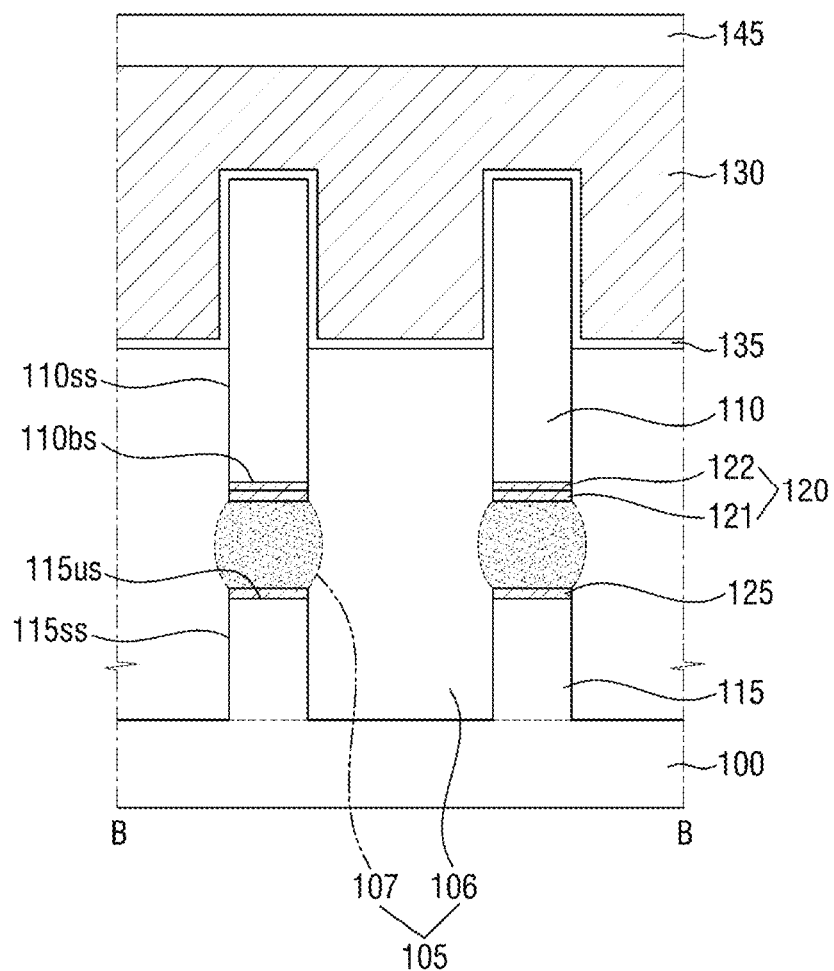
FIG. 12 is a diagram for explaining the semiconductor device according to some embodiments.

FIG. 12 is a diagram for explaining a semiconductor device according to some embodiments. For the convenience of explanation, the explanation will focus on the differences from the contents explained using FIG. 11.

Referring to FIG. 12, the first antioxidant pattern 120 may include a first sub-pattern 121 and a second sub-pattern 122.

The first sub-pattern 121 may be an undoped semiconductor material film. The second sub-pattern 122 may be a semiconductor material film including a doped first impurity.

The first sub-pattern 121 may include one of a silicon semiconductor pattern or a silicon germanium semiconductor pattern. The second sub-pattern 122 may include one of a silicon semiconductor pattern or a silicon germanium semiconductor pattern.

In the semiconductor device according to some embodiments, the stacked structure of the first antioxidant pattern 120 may be different from the stacked structure of the second antioxidant pattern 125.

Figure 13:
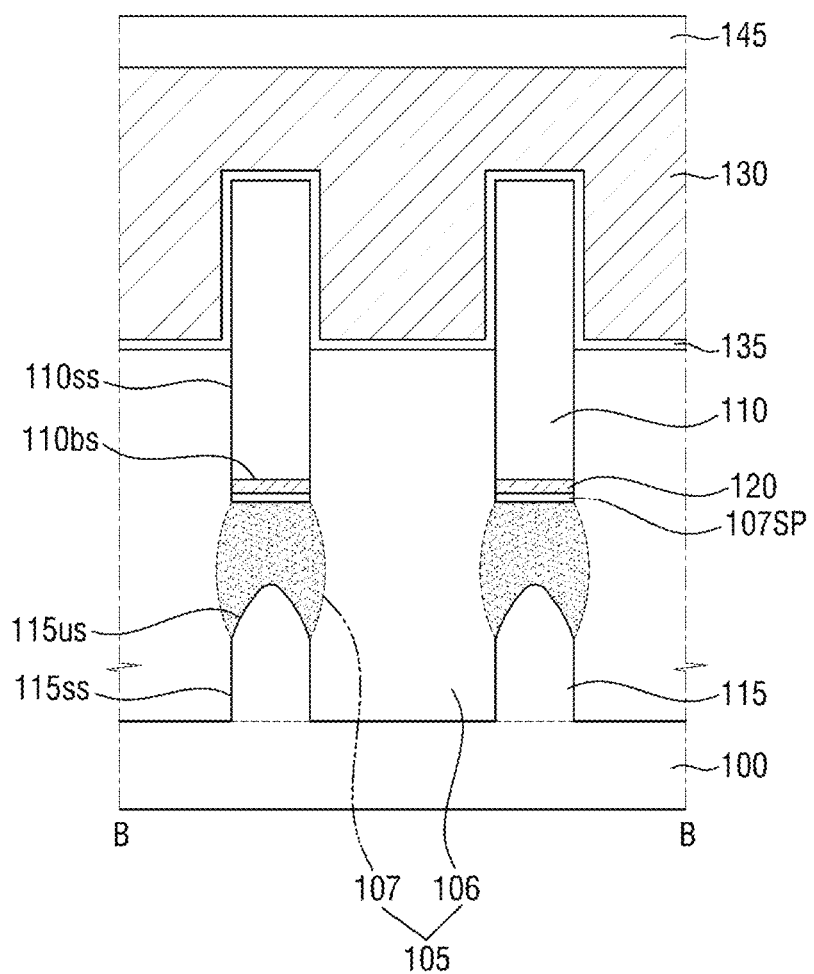
FIG. 13 is a diagram for explaining the semiconductor device according to some embodiments.

FIG. 13 is a diagram for explaining a semiconductor device according to some embodiments. For the convenience of explanation, the explanation will focus on the differences from the contents explained using FIGS. 1 through 6.

Referring to FIG. 13, the semiconductor device according to some embodiments may further include a sacrificial semiconductor pattern 107SP disposed between the first antioxidant pattern 120 and the fin type protruding pattern 115.

The sacrificial semiconductor pattern 107SP may be in direct contact with the first antioxidant pattern 120. The sacrificial semiconductor pattern 107SP is spaced apart from the fin type protruding pattern 115 in the third direction Z.

The sacrificial semiconductor pattern 107SP may include, for example, a silicon germanium semiconductor pattern. When the first antioxidant pattern 120 includes a silicon germanium semiconductor pattern, a germanium fraction of the first antioxidant pattern 120 is lower than a germanium fraction of the sacrificial semiconductor pattern 107SP.

Figure 30:
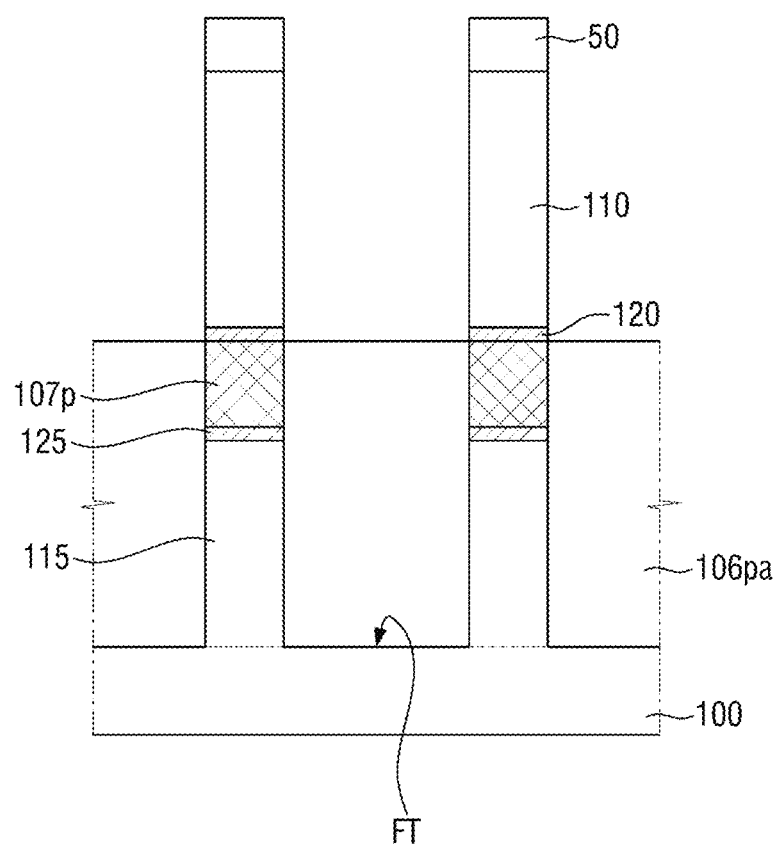

The sacrificial semiconductor pattern 107SP may be a semiconductor pattern that remains after oxidation of the sacrificial pattern (107p of FIG. 30). The sacrificial semiconductor pattern 107SP may be in direct contact with the stress insulating film 107.

Although the sacrificial semiconductor pattern 107SP is shown to extend entirely along the lower surface of the first antioxidant pattern 120, this is only for convenience of explanation, and inventive concepts are not limited thereto. The sacrificial semiconductor pattern 107SP may remain on a part of the lower surface of the first antioxidant pattern 120.

Figure 14:
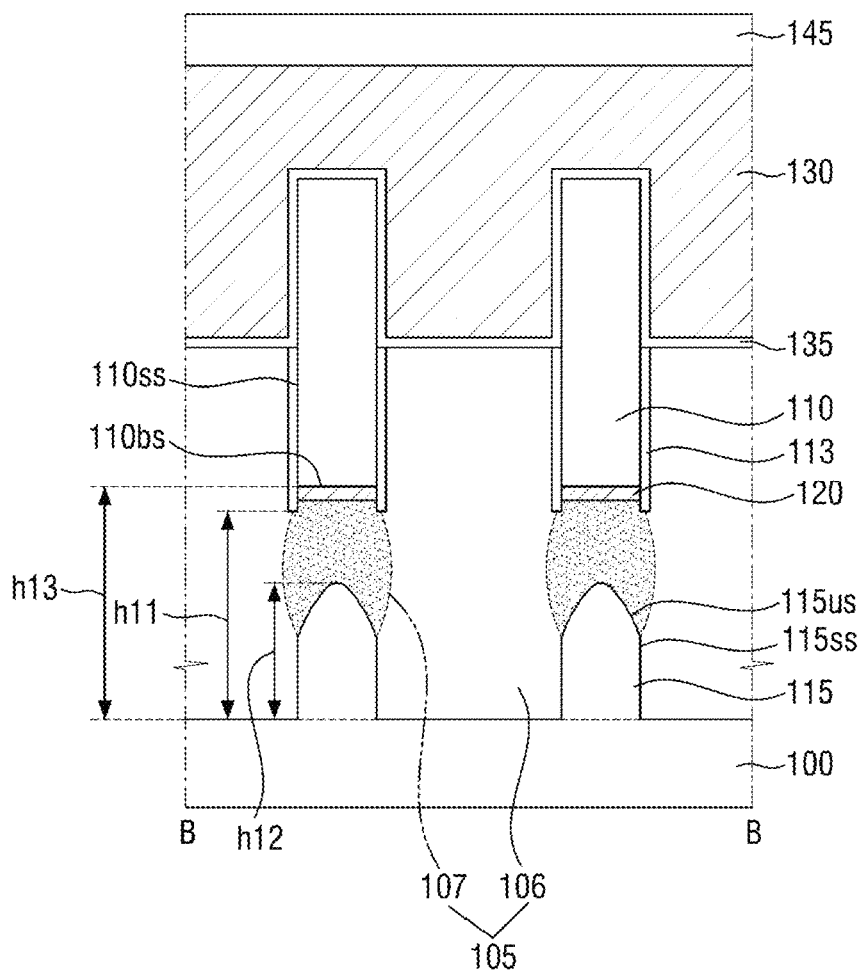
FIGS. 14 and 15 are diagrams for explaining the semiconductor device according to some embodiments.
Figure 15:
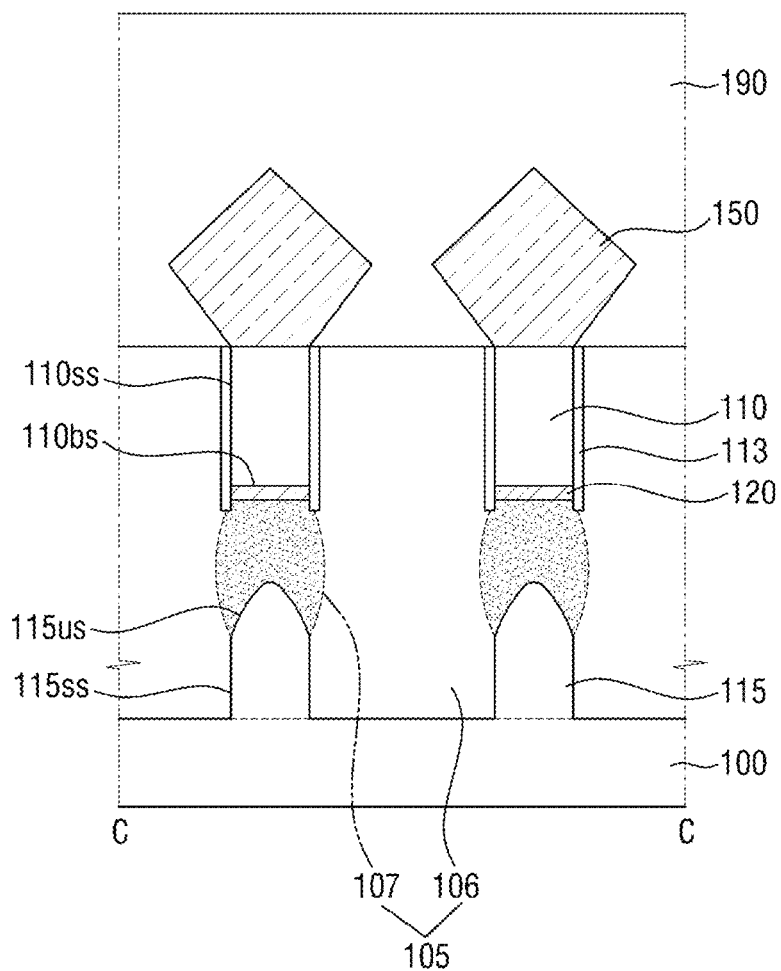

FIGS. 14 and 15 are diagrams for explaining the semiconductor device according to some embodiments. For the convenience of explanation, the explanation will focus on the differences from the contents explained using FIGS. 1 through 6.

For reference, FIG. 14 is a cross-sectional view taken along a line B-B of FIG. 1, and FIG. 15 is a cross-sectional view taken along a line C-C of FIG. 1.

Referring to FIGS. 14 and 15, the semiconductor device according to some embodiments may further include a fin liner 113 disposed on the side wall 110ss of the first channel semiconductor pattern 110.

The fin liner 113 may extend along at least a part of the side wall 110ss of the first channel semiconductor pattern. The fin liner 113 may cover at least a part of the side wall 110ss of the first channel semiconductor pattern.

For example, the fin liner 113 may extend along a part of the side wall 110ss of the first channel semiconductor pattern 110.

The fin liner 113 may be disposed between the first channel semiconductor pattern 110 and the first field insulating film 105. The fin liner 113 may be disposed on the side wall 110ss of the first channel semiconductor pattern to prevent or reduce the oxidation of the first channel semiconductor pattern 110.

The fin liner 113 is not in contact with the substrate 100. The fin liner 113 does not extend to the substrate 100.

In the semiconductor device according to some embodiments, the fin liners 113 disposed on the side walls 110ss of the adjacent first channel semiconductor patterns may be spaced apart from each other. The fin liners 113 disposed on the side walls 110ss of the adjacent first channel semiconductor patterns may be separated by the first field insulating film 105.

The fin liner 113 may include, for example, an insulating material film or a semiconductor material film. As an example, the fin liner 113 may include a silicon nitride film that is an insulating material film.

As another example, the fin liner 113 may include at least one of a silicon semiconductor film or a silicon germanium semiconductor film. The fin liner 113 may include a doped third impurity. The fin liner 113 may be a semiconductor material film including a doped third impurity. The third impurity doped in the fin liner 113 may be an oxidation-inhibiting impurity that inhibits oxidation of the first channel semiconductor pattern 110. The third impurity doped in the fin liner 113 may include, for example, at least one of oxygen (O), nitrogen (N), and carbon (C).

As still another example, the fin liner 113 may be an undoped semiconductor material film. The fin liner 113 may include at least one of an undoped silicon semiconductor film or silicon germanium semiconductor film.

On the basis of the upper surface of the substrate 100, the height of the lower surface of the fin liner 113 may be a first height h11. On the basis of the upper surface of the substrate 100, the height of the uppermost part of the fin type protruding pattern 115 may be a second height h12. On the basis of the upper surface of the substrate 100, the height of the bottom surface 110bs of the first channel semiconductor pattern may be a third height h13.

In the semiconductor device according to some embodiments, the height h11 of the lower surface of the fin liner 113 is higher than the height h12 of the uppermost part of the fin type protruding pattern 115.

In the semiconductor device according to some embodiments, the height h11 of the lower surface of the fin liner 113 is lower than the height h13 of the bottom surface 110bs of the first channel semiconductor pattern. That is, a part of the fin liner 113 may protrude toward the substrate 100 beyond the bottom surface 110bs of the first channel semiconductor pattern.

Figure 16:
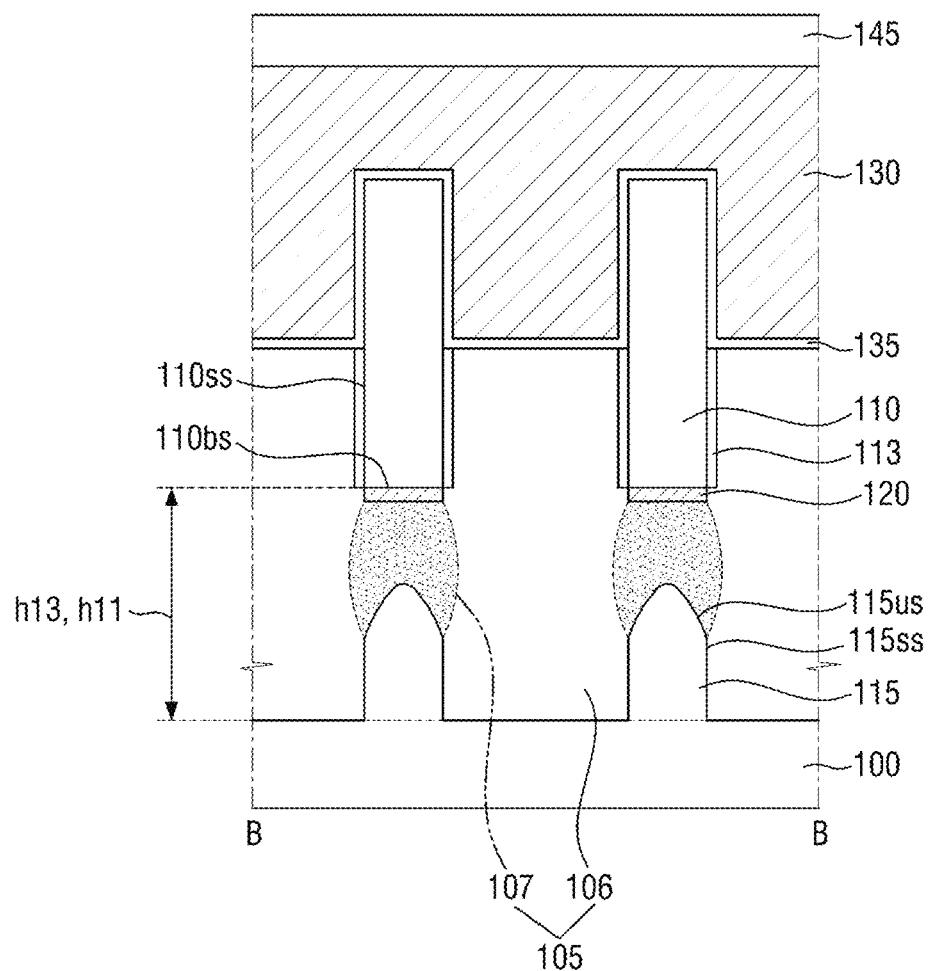
FIG. 16 is a diagram for explaining the semiconductor device according to some embodiments.
Figure 17:
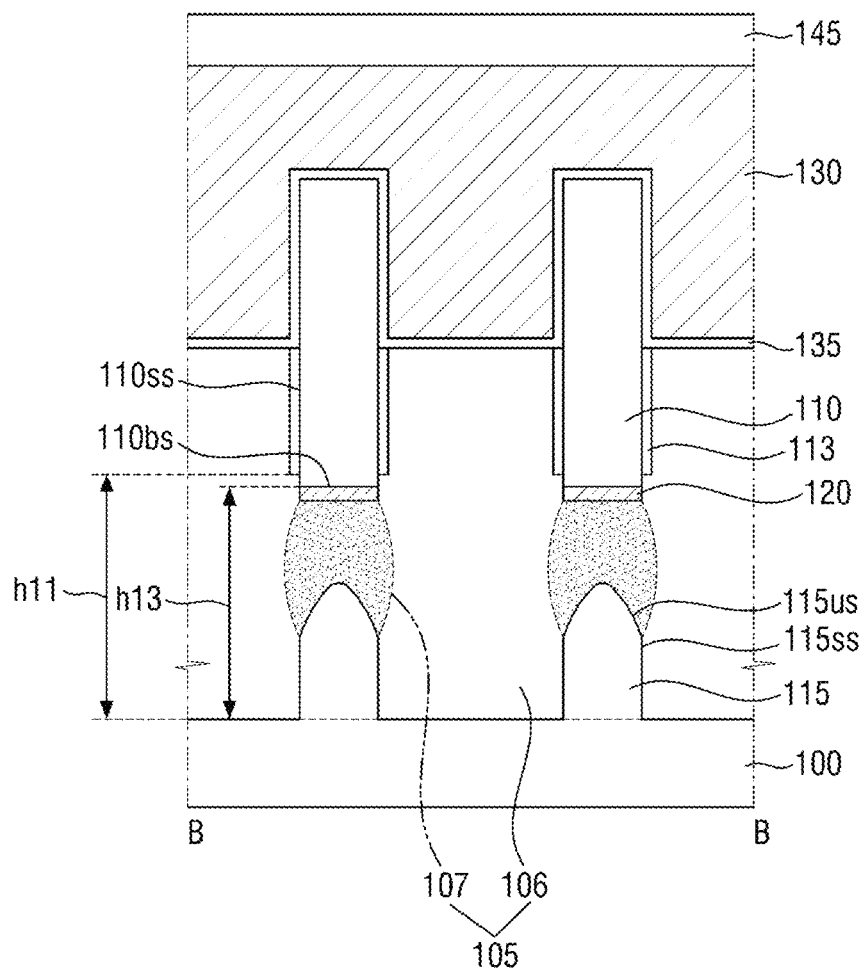
FIG. 17 is a diagram for explaining the semiconductor device according to some embodiments.

FIG. 16 is a diagram for explaining the semiconductor device according to some embodiments. FIG. 17 is a diagram for explaining the semiconductor device according to some embodiments. For the convenience of explanation, the explanation will focus on the differences from the contents explained using FIGS. 14 and 15.

Referring to FIG. 16, in the semiconductor device according to some embodiments, the height h11 of the lower surface of the fin liner 113 may be the same as the height h13 of the bottom surface 110bs of the first channel semiconductor pattern.

The fin liner 113 may not extend along the side walls of the first antioxidant pattern 120.

Referring also to FIG. 17, in the semiconductor device according to some embodiments, the height h11 of the lower surface of the fin liner 113 is higher than the height h13 of the bottom surface 110*bs* of the first channel semiconductor pattern.

The fin liner 113 may not extend to the bottom surface 110*bs* of the first channel semiconductor pattern.

Unlike the shown configuration, the first channel semiconductor pattern 110 may include an oxide pattern formed on the side wall 110*ss* of the first channel semiconductor pattern, between the lower surface of the fin liner 113 and the first antioxidant pattern 120. The oxide pattern included in the first channel semiconductor pattern 110 may have a form in which a material included in the first channel semiconductor pattern 110 is oxidized.

Figure 18:
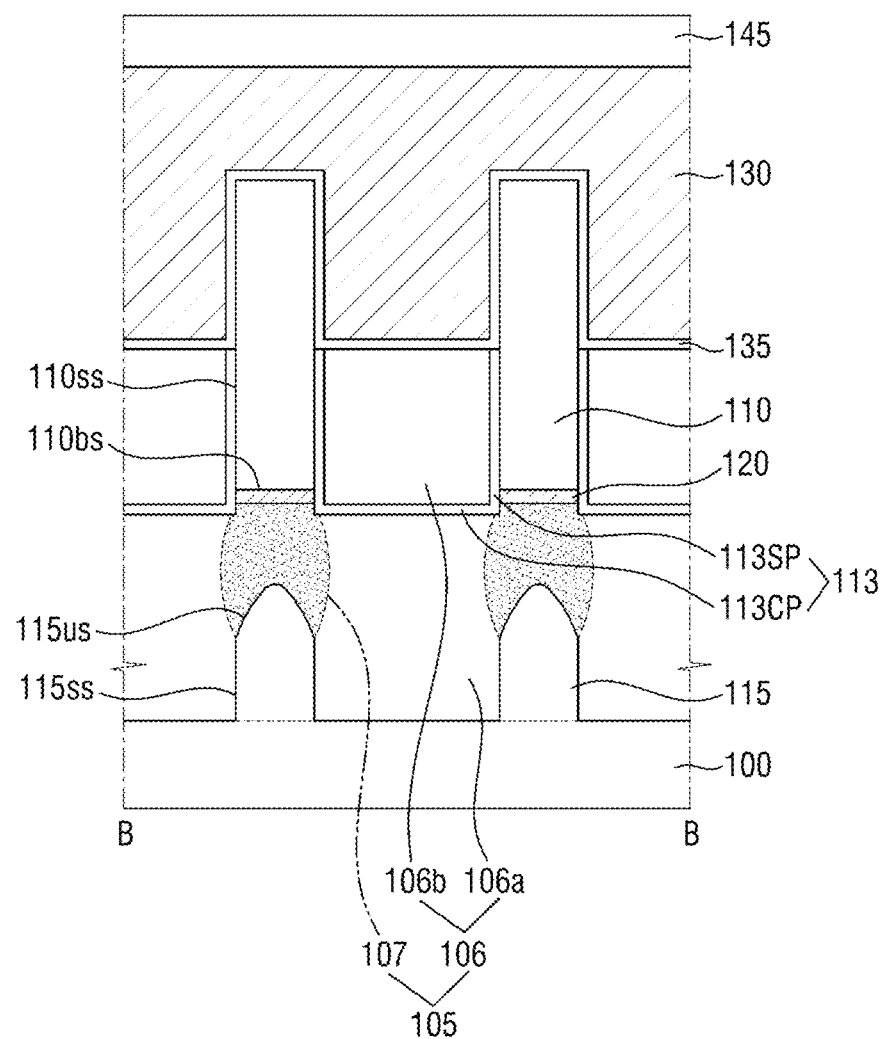
FIG. 18 is a diagram for explaining the semiconductor device according to some embodiments.
Figure 19:
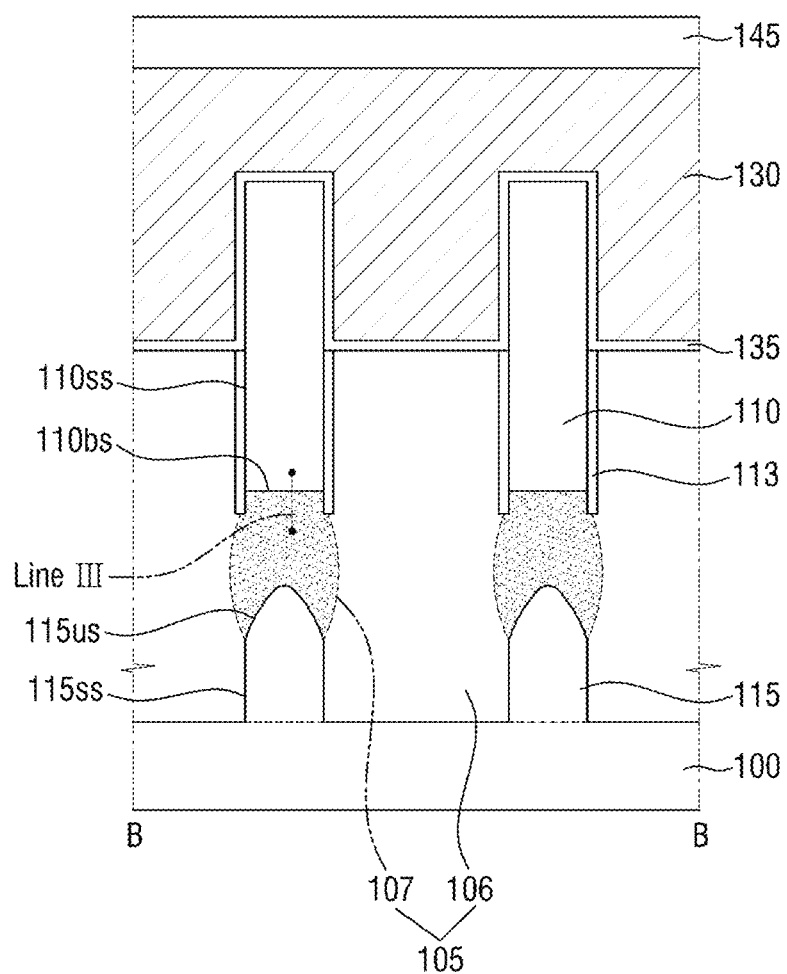
FIGS. 19 and 20 are diagrams for explaining the semiconductor device according to some embodiments.
Figure 20:
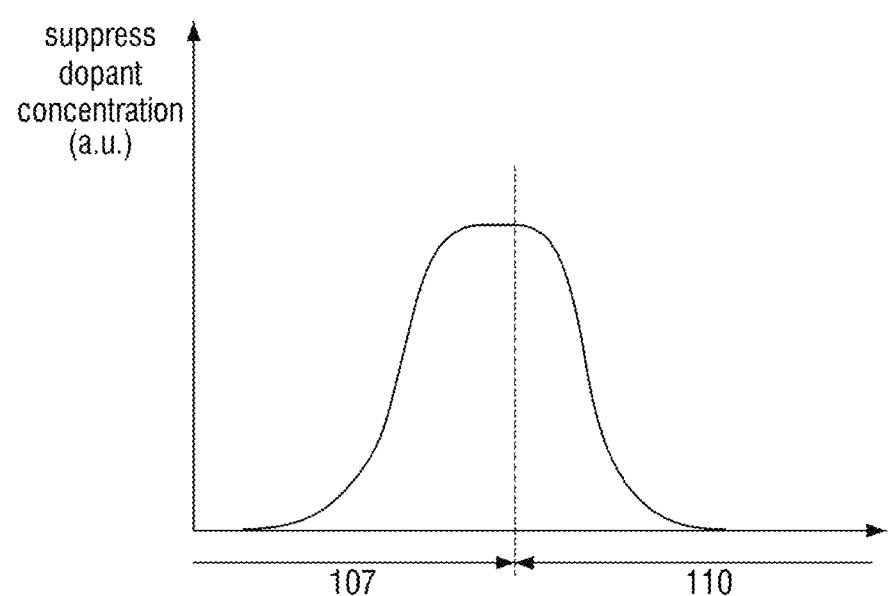

FIG. 18 is a diagram for explaining the semiconductor device according to some embodiments. FIGS. 19 and 20 are diagrams for explaining the semiconductor device according to some embodiments. For the convenience of explanation, the explanation will focus on the differences from the contents explained using FIGS. 14 and 15.

For reference, FIG. 20 is a schematic graph showing the concentration of oxidation-inhibiting impurity along a Line III of FIG. 19.

Referring to FIG. 18, in the semiconductor device according to some embodiments, the fin liner 113 may include a side wall liner 113SP and a protruding liner 113CP.

The side wall liner 113SP may be a portion extending along the side wall 110*ss* of the first channel semiconductor pattern. The protruding liner 113CP may be a protruding part that protrudes from the side wall 110*ss* of the first channel semiconductor pattern. The protruding liner 113CP may protrude from a lower end of the side wall liner 113SP in a direction perpendicular to the side wall 110*ss* of the first channel semiconductor pattern 110.

The side wall liners 113SP may be formed on each of the side walls 110*ss* of the first channel semiconductor pattern spaced apart from each other in the second direction (Y1 of FIG. 1). The protruding liner 113CP may connect the side wall liners 113SP each formed on the side walls 110*ss* of the first channel semiconductor pattern spaced apart from each other in the second direction Y1.

The filling insulating film 106 may be divided into an upper filling insulating film 106*b* and a lower filling insulating film 106*a* by the protruding liner 113CP.

The upper filling insulating film 106*b* may cover at least a part of the side wall 110*ss* of the first channel semiconductor pattern. However, the upper filling insulating film 106*b* does not cover the side wall 115*ss* of the fin type protruding pattern. The lower filling insulating film 106*a* may cover the side wall of the fin type protruding pattern.

Referring to FIGS. 19 and 20, in the semiconductor device according to some embodiments, the bottom surface 110*bs* of the first channel semiconductor pattern 110 may be in contact with the first field insulating film 105.

The bottom surface 110*bs* of the first channel semiconductor pattern may be in contact with the stress insulating film 107.

During the process of forming the stress insulating film 107, all the first antioxidant patterns (120 of FIG. 35) may be oxidized. In such a case, the bottom surface 110*bs* of the first channel semiconductor pattern may be in contact with the stress insulating film 107.

While all the first antioxidant patterns 120 are oxidized, the oxidation-inhibiting impurity (the first impurity) in the first antioxidant pattern 120 may be diffused into the stress insulating film 107 and the first channel semiconductor pattern 110.

In FIG. 20, the concentration of the oxidation-inhibiting impurity (the first impurity) may be highest in the portion of the stress insulating film 107 that forms a boundary with the first channel semiconductor pattern 110. Further, as it goes away from the bottom surface of the first channel semiconductor pattern, the concentration of the oxidation-inhibiting impurity (the first impurity) in the first field insulating film 105 may decrease.

Figure 21:
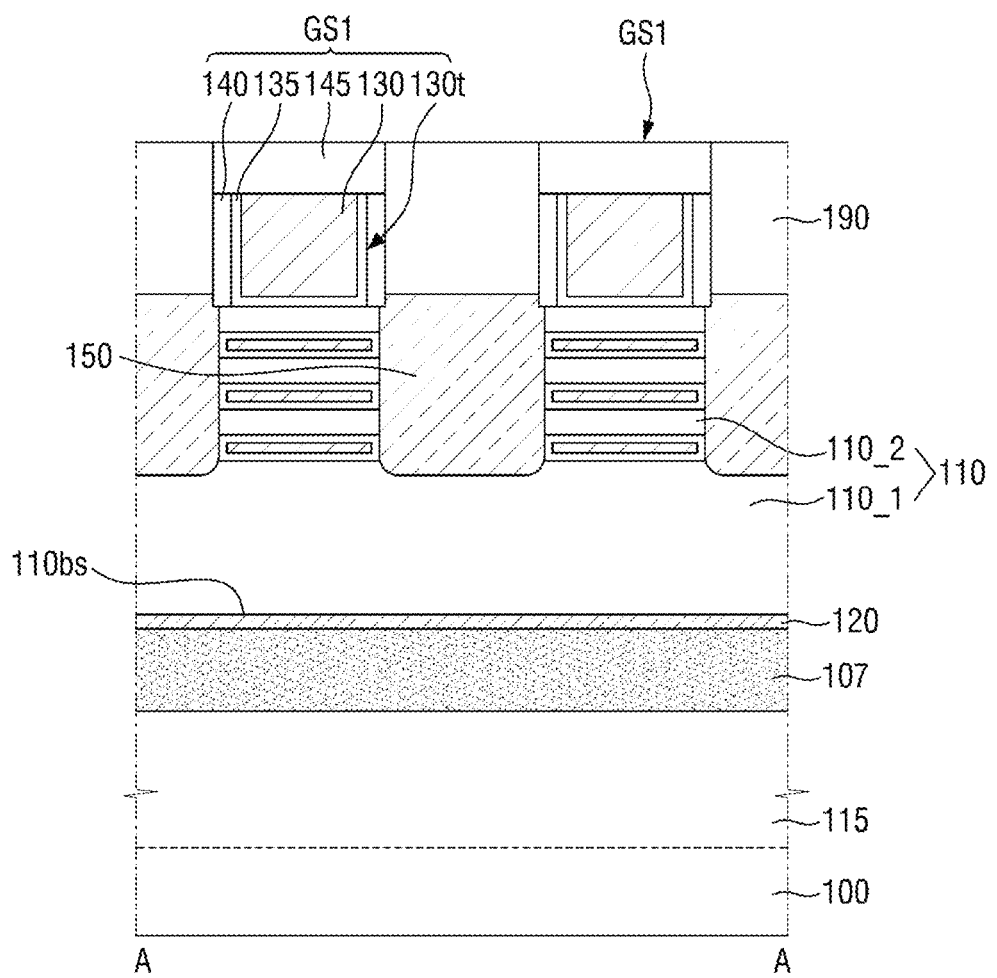
FIGS. 21 and 22 are diagrams for explaining semiconductor devices according to some embodiments.
Figure 22:
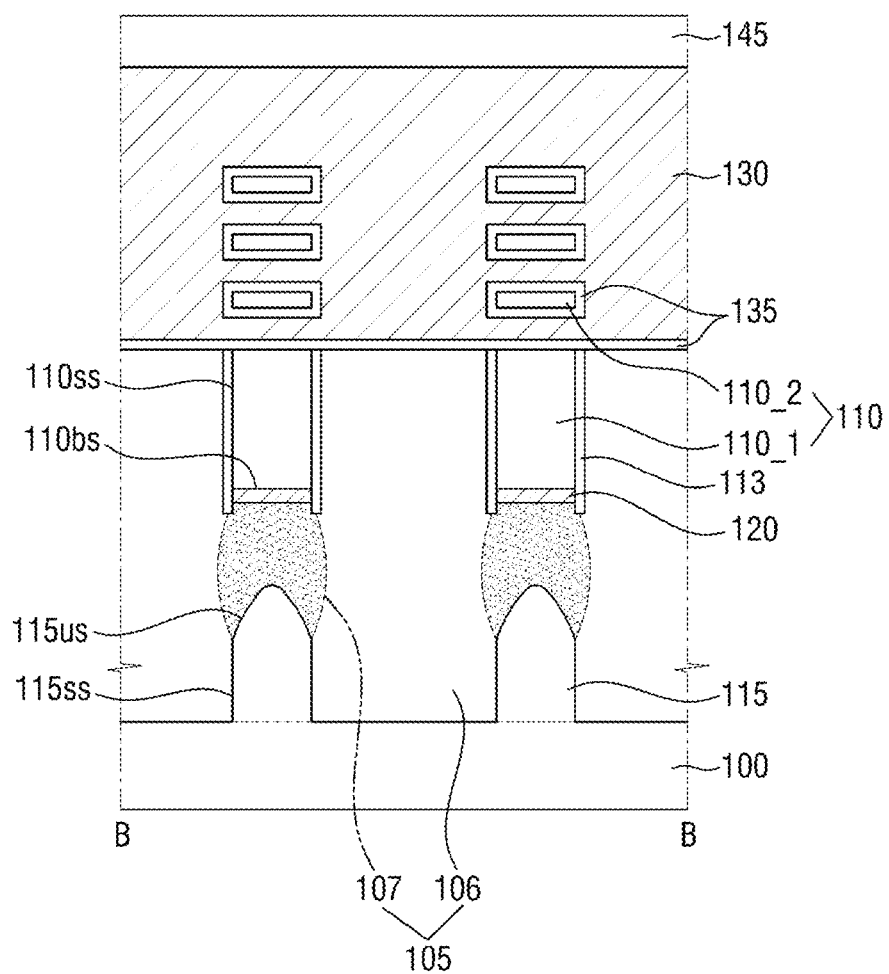

FIGS. 21 and 22 are diagrams for explaining the semiconductor device according to some embodiments. For the convenience of explanation, the explanation will focus on the differences from the contents explained using FIGS. 1 through 6.

For reference, FIGS. 21 and 22 may be cross-sectional views taken along lines A-A and B-B of FIG. 1.

Referring to FIGS. 21 and 22, in the semiconductor device according to some embodiments, the first channel semiconductor pattern 110 may include a lower semiconductor pattern 110_1 and an upper semiconductor pattern 110_2.

The upper semiconductor pattern 110_2 may be disposed on the lower semiconductor pattern 110_1. The upper semiconductor pattern 110_2 may be spaced apart from the lower semiconductor pattern 110_1 in the third direction (Z of FIG. 1). The upper semiconductor pattern 110_2 may be disposed to be higher than the upper surface of the first field insulating film 105.

Each of the lower semiconductor pattern 110_1 and the upper semiconductor pattern 110_2 may include silicon, which is an elemental semiconductor material. Further, each of the lower semiconductor pattern 110_1 and the upper semiconductor pattern 110_2 may include the compound semiconductor, and may include, for example, an IV-IV group compound semiconductor or an III-V group compound semiconductor.

The material contained in the lower semiconductor pattern 110_1 and the material contained in the upper semiconductor pattern 110_2 may be the same or different from each other.

The first field insulating film 105 may cover at least a part of the side wall of the lower semiconductor pattern 110_1. The first field insulating film 105 may not cover the side wall of the upper semiconductor pattern 110_2.

The fin liner 113 may be disposed on the side wall of the lower semiconductor pattern 110_1. The fin liner 113 is not disposed on the side wall of the upper semiconductor pattern 110_2. The upper surface of the fin liner 113 does not extend to the upper semiconductor pattern 110_2.

The first gate insulating film 135 and the first gate electrode 130 may wrap around the upper semiconductor pattern 110_2.

Although three upper semiconductor patterns 110_2 are shown as being disposed on the lower semiconductor pattern 110_1, this is only for convenience of explanation, and the number thereof is not limited thereto.

The first epitaxial pattern 150 may be disposed on the lower semiconductor pattern 110_1. The upper semiconductor pattern 110_2 may be connected to the first epitaxial pattern 150.

Figure 23:
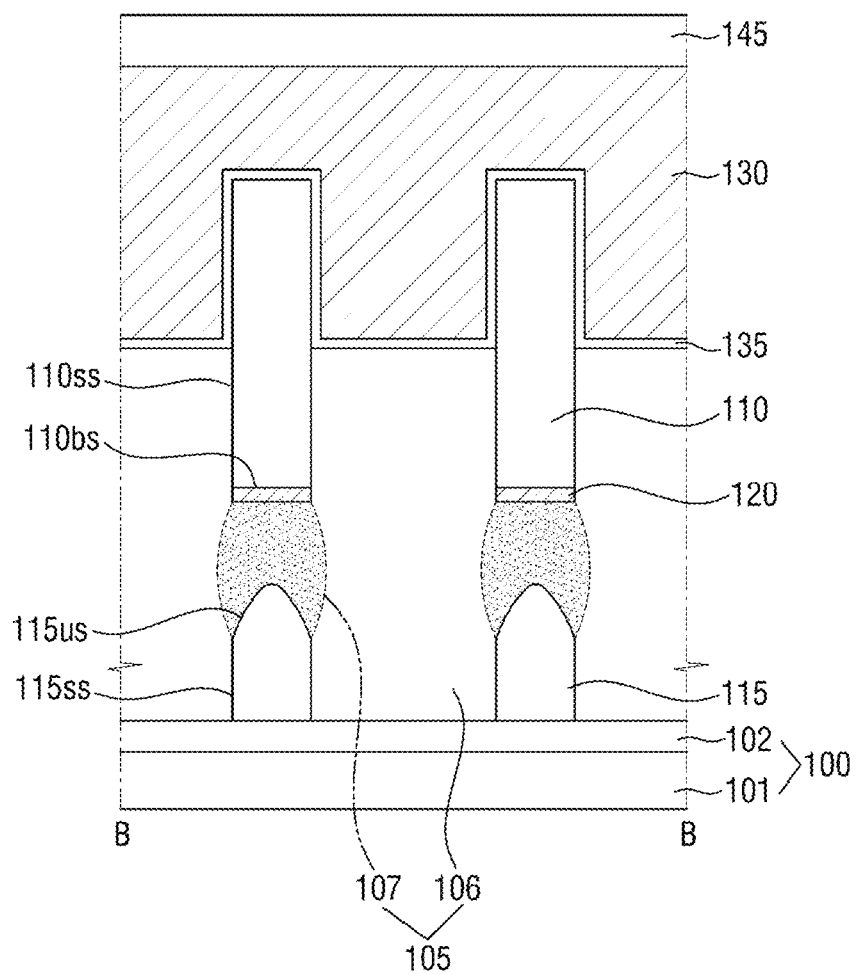
FIG. 23 is a diagram for explaining the semiconductor device according to some embodiments.
Figure 24:
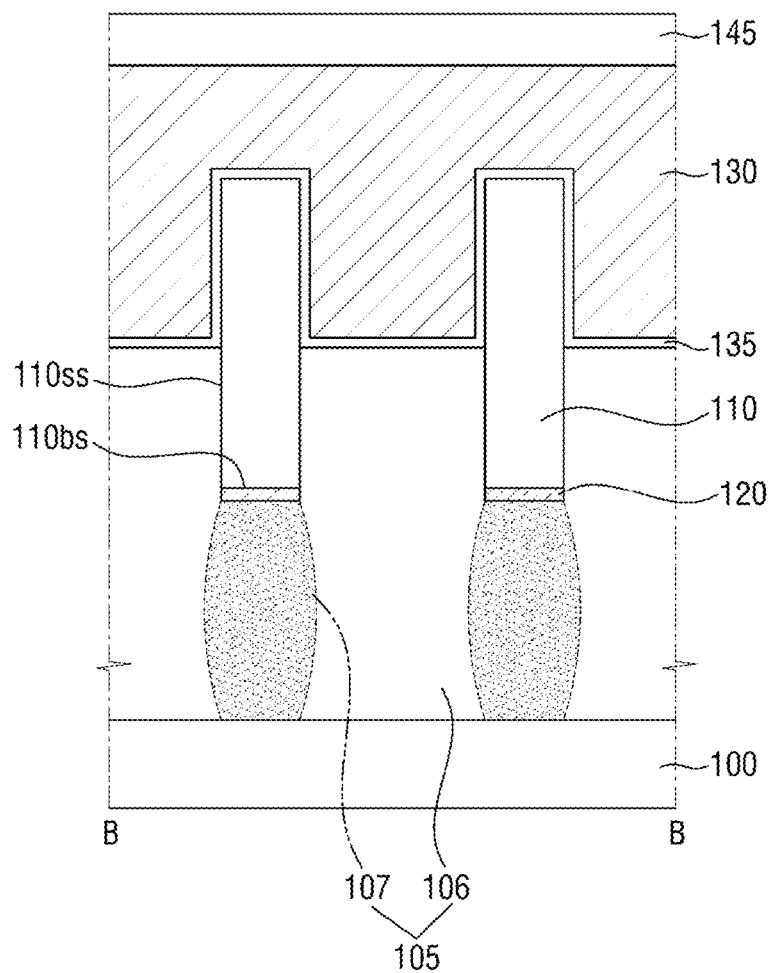
FIG. 24 is a diagram for explaining the semiconductor device according to some embodiments.

FIG. 23 is a diagram for explaining the semiconductor device according to some embodiments. FIG. 24 is a diagram for explaining the semiconductor device according to some embodiments. For the convenience of explanation, the explanation will focus on the differences from the contents explained using FIGS. 1 through 6.

Referring to FIG. 23, in the semiconductor device according to some embodiments, the substrate 100 may include a base substrate 101, and a buried insulating film 102 on the base substrate 101.

The base substrate 101 may include a semiconductor material. The buried insulating film 102 may include an insulating material.

The fin type protruding pattern 115 may be disposed on the buried insulating film 102.

Referring to FIG. 24, in the semiconductor device according to some embodiments, the stress insulating film 107 may extend to the upper surface of the substrate 100.

The stress insulating film 107 may be in direct contact with the substrate 100.

Figure 25:
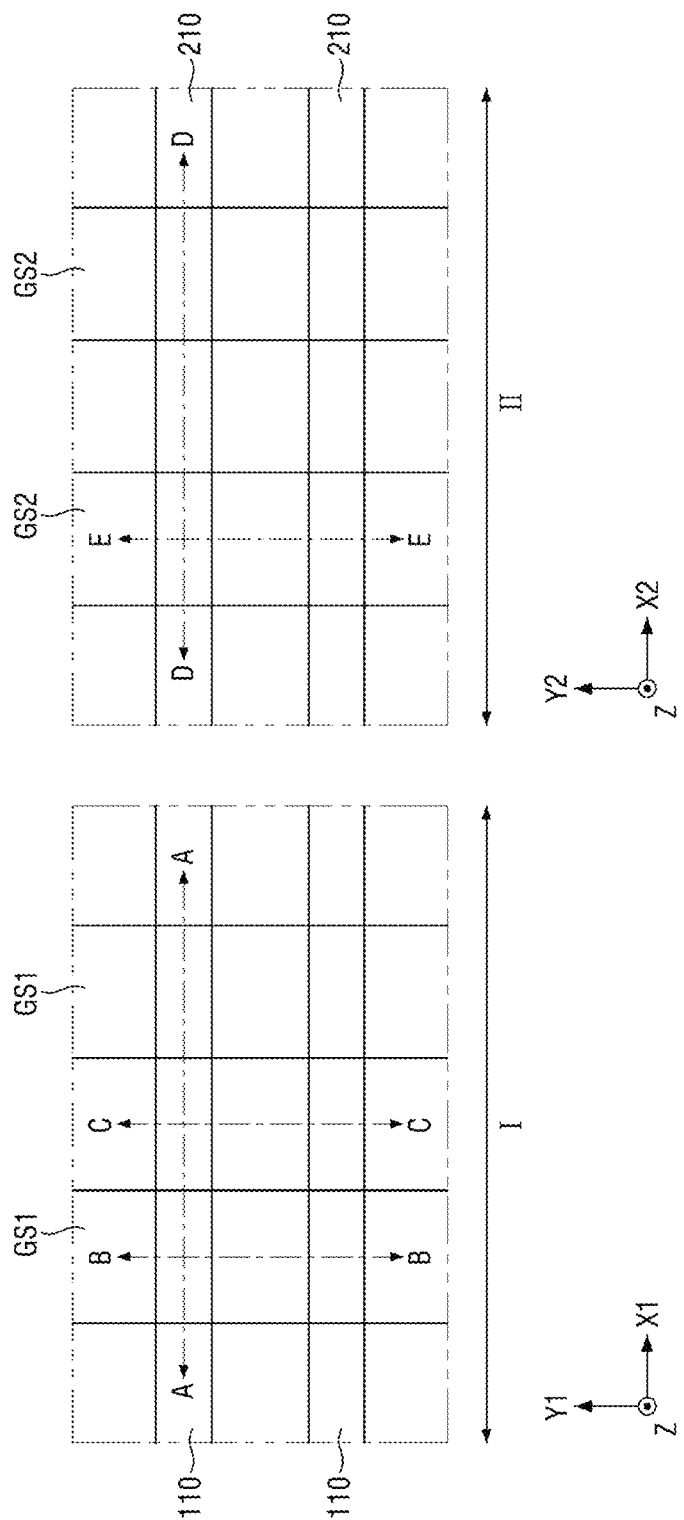
FIG. 25 is a schematic layout diagram for explaining the semiconductor device according to some embodiments.
Figure 26:
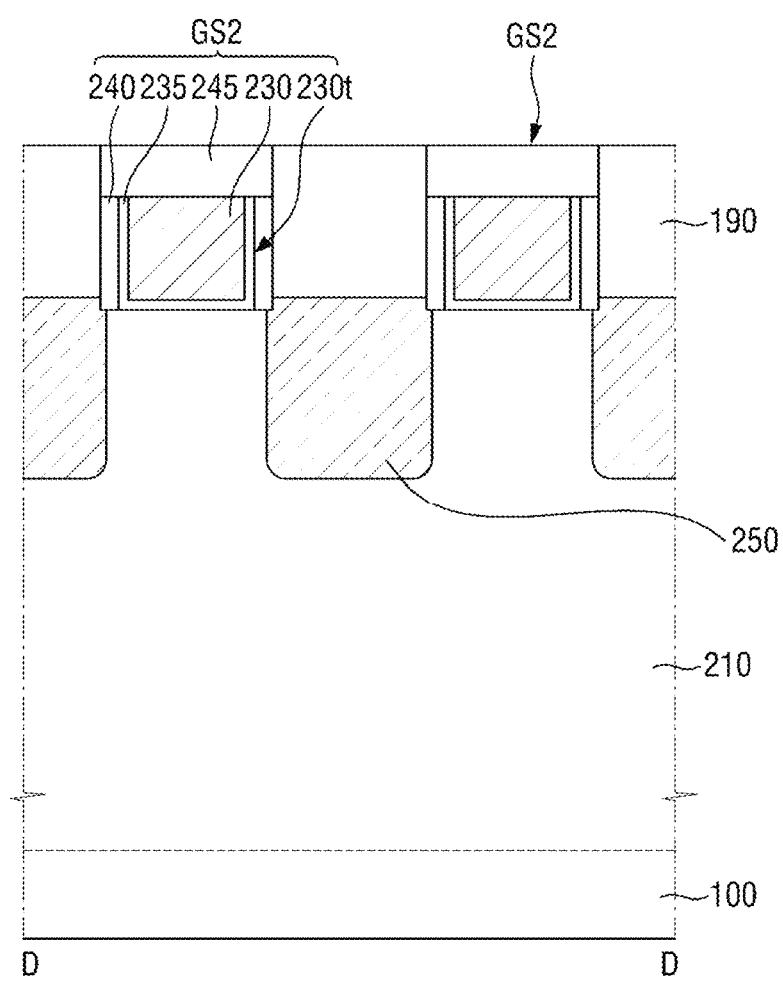
FIG. 26 is a cross-sectional view taken along a line D-D of FIG. 25.
Figure 27:
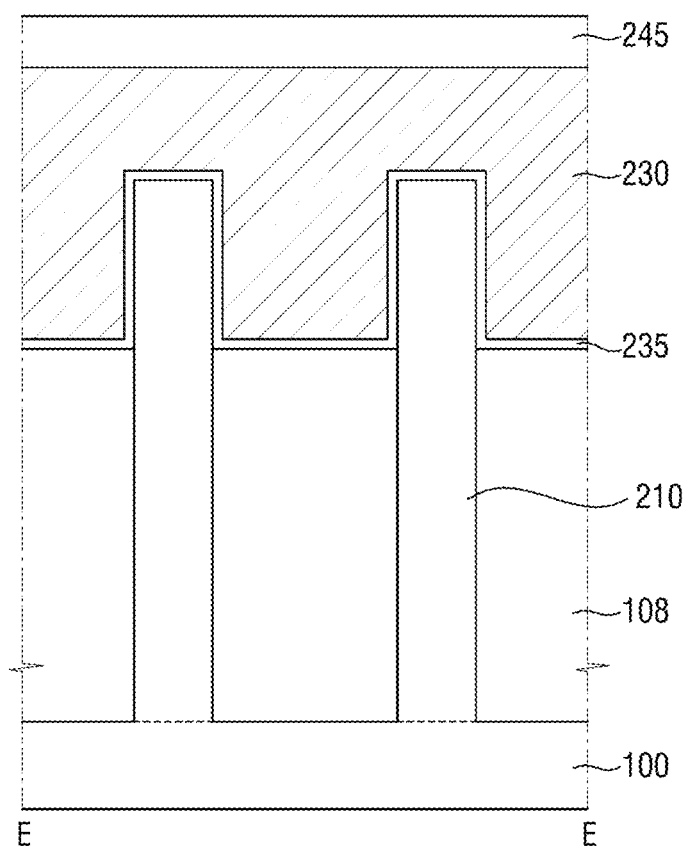
FIG. 27 is a cross-sectional view taken along a line E-E of FIG. 25.

FIG. 25 is a schematic layout diagram for explaining the semiconductor device according to some embodiments. FIG. 26 is a cross-sectional view taken along a line D-D of FIG. 25. FIG. 27 is a cross-sectional view taken along a line E-E of FIG. 25.

For reference, a first region I of FIG. 25 may be substantially the same as the contents described using FIGS. 1 through 24. For convenience of explanation, the following explanation will be focused on the second region II of FIG. 25.

Referring to FIGS. 25 to 27, the substrate 100 may include a first region I and a second region II. The first region I and the second region II may be regions that are spaced apart from each other or may be regions that are connected to each other.

The first region I and the second region II may be, for example, one of a logic region, an SRAM region, and an input/output IO region. That is, the first region I and the second region II may be regions that have the same function as each other or regions that have different functions from each other.

The second channel semiconductor pattern 210, the second field insulating film 108, and the second gate structure GS2 may be formed in the second region II of the substrate 100.

The second channel semiconductor pattern 210 may protrude from the substrate 100. The fin type protruding pattern 115 may extend long along a fourth direction X2. Adjacent second channel semiconductor patterns 210 may be spaced apart from each other in a fifth direction Y2.

The second channel semiconductor pattern 210 may include silicon or germanium, which is an elemental semiconductor material. In addition, the second channel semiconductor pattern 210 may include a compound semiconductor, and may include, for example, a group IV-IV compound semiconductor or a group III-V compound semiconductor.

The second field insulating film 108 may cover a part of the side wall of the second channel semiconductor pattern 210. A part of the second channel semiconductor pattern 210 protrudes upward from the upper surface of the second field insulating film 108.

The second gate structure GS2 may extend in the fifth direction Y2 and intersect the second channel semiconductor pattern 210. The second gate structure GS2 may be disposed on the second field insulating film 108 and the second channel semiconductor pattern 210.

Although the second gate structure GS2 is shown to intersect simultaneously a plurality of adjacent second channel semiconductor patterns 210, inventive concepts are not limited thereto. That is, the two shown second channel semiconductor patterns 210 may of course intersect the second gate structures GS2 separated from each other.

The second gate structure GS2 may include a second gate electrode 230, a second gate insulating film 235, a second gate spacer 240 defining a second gate trench 230t, and a second capping pattern 245.

FIGS. 28 to 32 are intermediate stage diagrams for explaining a method for fabricating a semiconductor device according to some embodiments.

Figure 28:
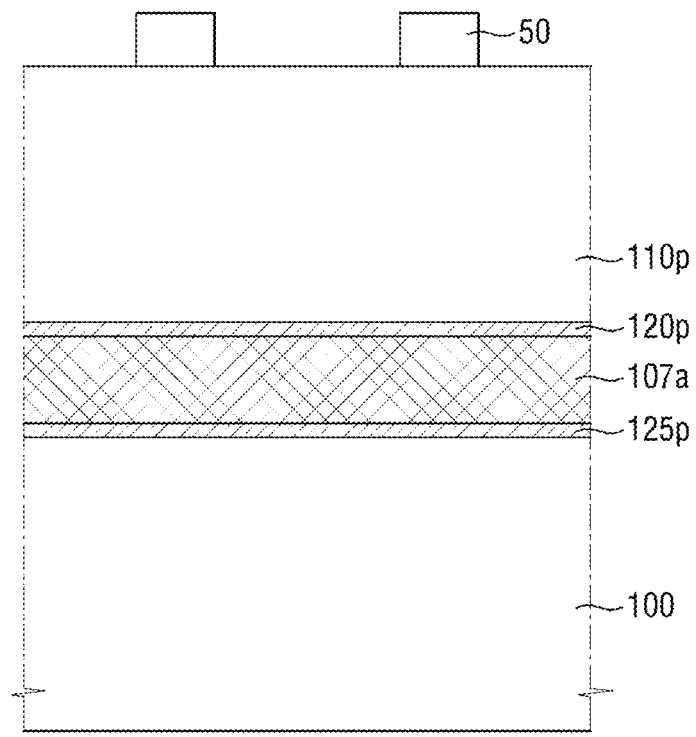
FIGS. 28 to 32 are intermediate stage diagrams for explaining a method for fabricating a semiconductor device according to some embodiments.

Referring to FIG. 28, a lower antioxidant film 125p may be formed on the substrate 100.

The lower antioxidant film 125p may be formed through, for example, an epitaxial growth process. The lower antioxidant film 125p may include a semiconductor material film containing a second impurity. The lower antioxidant film 125p may include, for example, a silicon film or a silicon germanium film.

As an example, during the formation of the lower antioxidant film 125p, the second impurity may be provided together with a precursor that forms the semiconductor material film. As another example, after the semiconductor material film is epitaxially grown, the second impurity may be provided to the surface of the semiconductor material film. By repeating such a process, the lower antioxidant film 125p may be formed.

A sacrificial film 107a may be formed on the lower antioxidant film 125p. The sacrificial film 107a may be formed through, for example, an epitaxial growth process. The sacrificial film 107a may include, for example, a silicon germanium film or a germanium film.

An upper antioxidant film 120p may be formed on the sacrificial film 107a. The upper antioxidant film 120p may be formed through, for example, an epitaxial growth process. The upper antioxidant film 120p may include a semiconductor material film including a first impurity. The upper antioxidant film 120p may include, for example, a silicon film or a silicon germanium film.

When the upper antioxidant film 120p includes a silicon germanium film, the germanium fraction of the upper antioxidant film 120p is smaller than the germanium fraction of the sacrificial film 107a.

As an example, during the formation of the upper antioxidant film 120p, the first impurity may be provided together with a precursor that forms the semiconductor material film. As another example, after the semiconductor material film is epitaxially grown, the first impurity may be provided to the surface of the semiconductor material film. By repeating such a process, the upper antioxidant film 120p may be formed.

The semiconductor film 110p may be formed on the upper antioxidant film 120p. The semiconductor film 110p may be formed through, for example, an epitaxial growth process.

A mask pattern 50 may be formed on the semiconductor film 110p.

Unlike the shown configuration, the sacrificial film 107a may be directly formed on the substrate 100, without forming the lower antioxidant film 125p.

Figure 29:
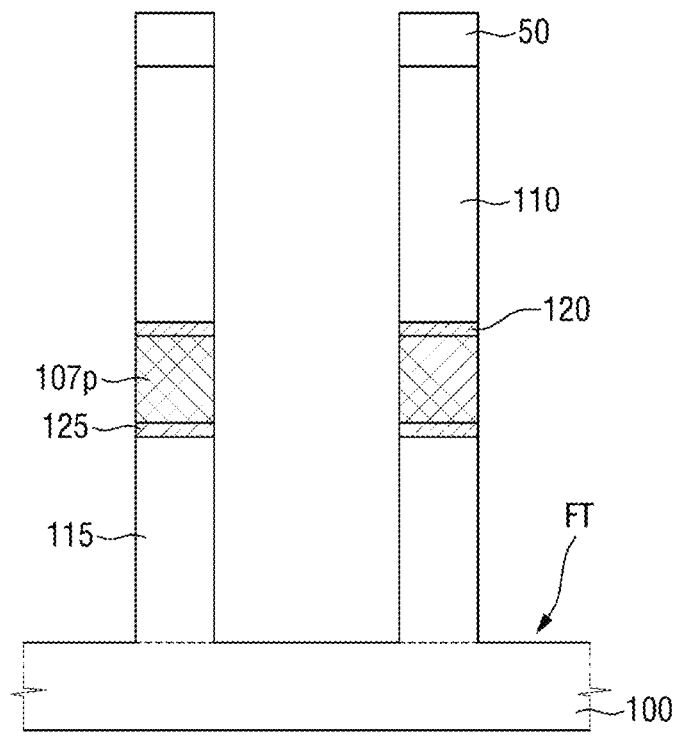

Referring to FIG. 29, a fin trench FT may be formed, using the mask pattern 50.

The fin trench FT may be formed in the semiconductor film 110p, the upper antioxidant film 120p, the sacrificial film 107a, the lower antioxidant film 125p, and the substrate 100.

As the fin trench FT is formed, the fin type protruding pattern 115, the second antioxidant pattern 125, the sacrificial pattern 107p, the first antioxidant pattern 120, and the first channel semiconductor pattern 110 may be formed. For example, the second antioxidant pattern 125 is formed by patterning the lower antioxidant film 125p. The fin type protruding pattern 115 may be formed by the extension of the fin trench FT into the substrate 100.

Referring to FIG. 30, a pre-lower filling film 106pa may be formed in the fin trench FT.

The pre-lower filling film 106pa may fill a part of the fin trench FT. The pre-lower filling film 106pa may cover at least a part of the side wall of the sacrificial pattern 107p.

After the pre-lower filling film 106pa that fills the fin trench FT is formed, a part of the pre-lower filling film 106pa may be removed. Accordingly, the pre-lower filling film 106pa that fills a part of the fin trench FT may be formed.

Figure 31:
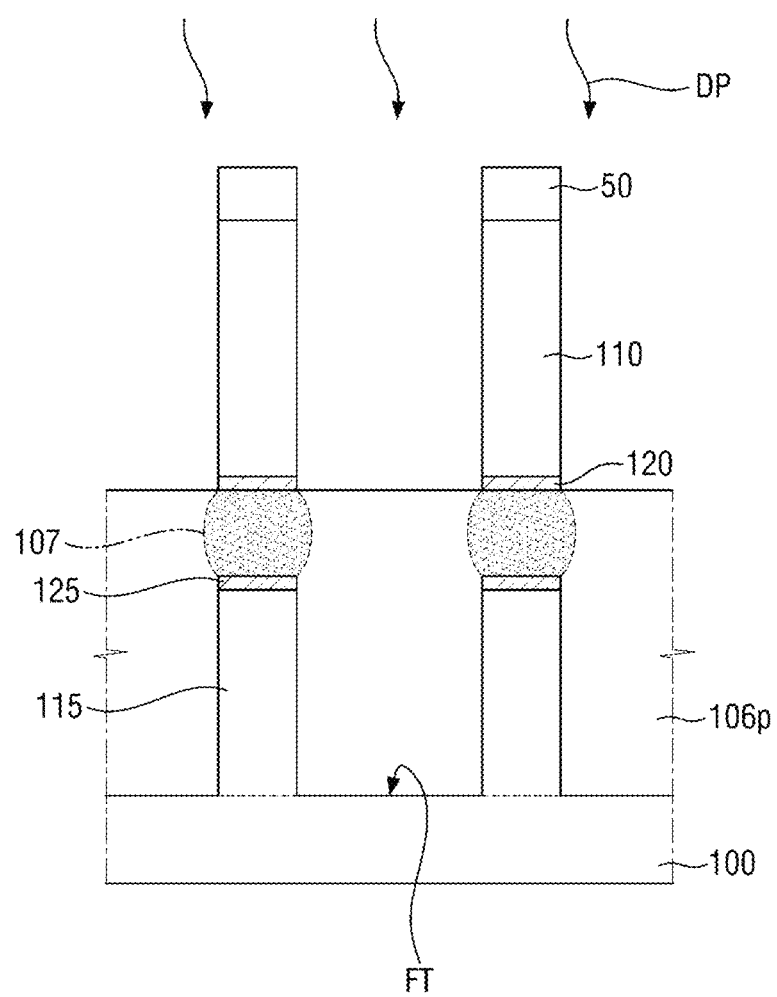

Referring to FIG. 31, the first filling insulating film 106p may be formed in the fin trench FT through a densification process DP of the pre-lower filling film 106pa.

The first filling insulating film 106p may be formed by densification of the pre-lower filling film 106pa. The densification process DP may be performed, for example, while supplying oxygen (O) to the pre-lower filling film 106pa.

The sacrificial pattern 107p may be oxidized during execution of the densification process DP. The sacrificial pattern 107p may be oxidized to form a stress insulating film 107.

During the formation of the stress insulating film 107, the first antioxidant pattern 120 may limit and/or prevent the first channel semiconductor pattern 110 from being oxidized.

Unlike the shown configuration, at least a part of the second antioxidant pattern 125 and/or at least a part of the fin type protruding pattern 115 may be oxidized during execution of the densification process DP.

Alternatively, when the second antioxidant pattern 125 is not formed, a part of the upper part of the fin type protruding pattern 115 may be oxidized during execution of the densification process DP.

Figure 32:
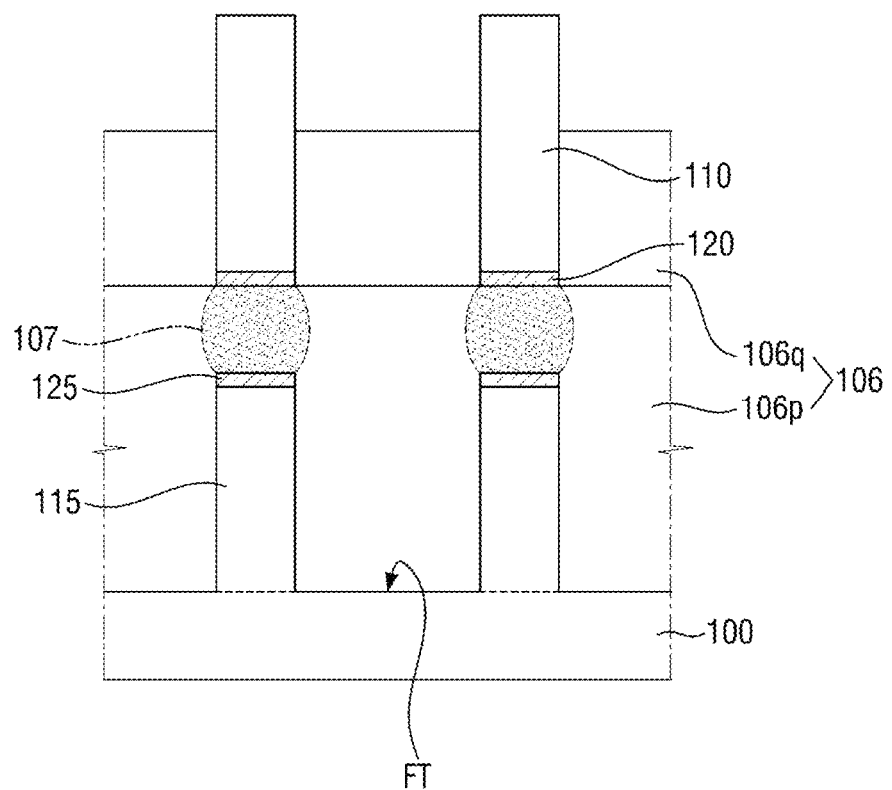

Referring to FIG. 32, a second filling insulating film 106q may be formed on the first filling insulating film 106p. Therefore, the filling insulating film 106 may be formed.

The second filling insulating film 106q does not entirely cover the side wall of the first channel semiconductor pattern 110. A part of the first channel semiconductor pattern 110 protrudes beyond the upper surface of the filling insulating film 106p.

The mask pattern 50 is removed.

Figure 33:
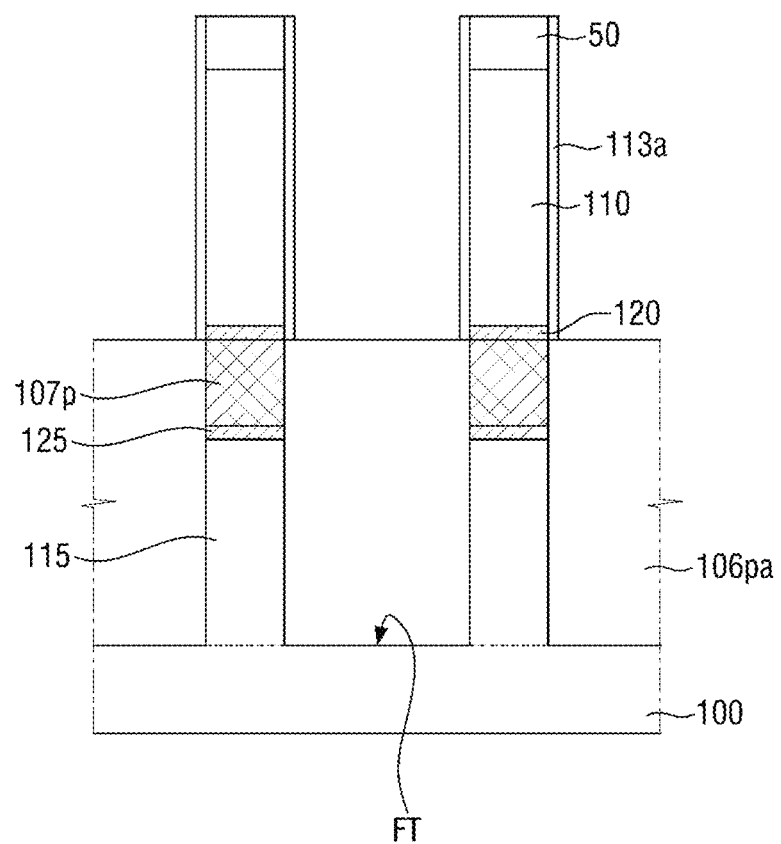
FIGS. 33 to 36 are intermediate stage diagrams for explaining the method for fabricating the semiconductor device according to some embodiments.

FIGS. 33 to 36 are intermediate stage diagrams for explaining a method for fabricating a semiconductor device according to some embodiments. FIG. 33 may be a process step performed after FIG. 30.

Referring to FIG. 33, a pre-fin liner film 113a may be formed along at least a part of the side wall of the first channel semiconductor pattern 110.

The pre-fin liner film 113a may be formed along at least a part of the side wall of the first channel semiconductor pattern 110, and the upper surface of the pre-lower filling film 106pa. Subsequently, the pre-fin liner film 113a on the upper surface of the pre-lower filling film 106pa may be removed.

Unlike the shown configuration, the pre-fin liner film 113a on the upper surface of the pre-lower filling film 106pa may not be removed.

Figure 34:
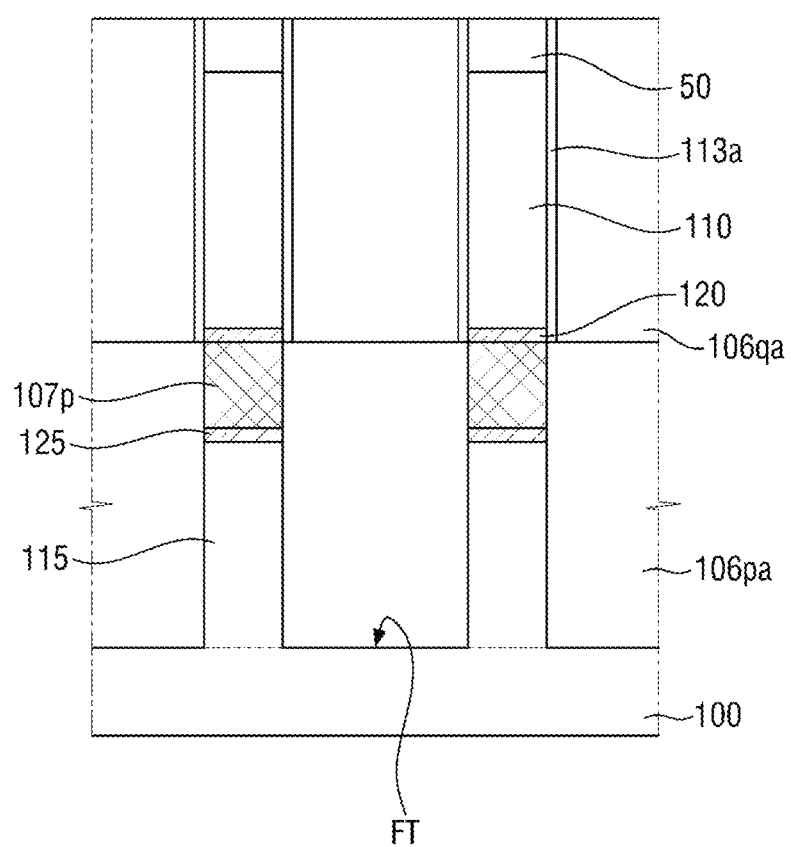

Referring to FIG. 34, the pre-upper filling film 106qa may be formed on the pre-lower filling film 106pa.

The pre-upper filling film 106qa may fill the fin trench FT. The pre-upper filling film 106qa may cover the pre-fin liner film 113a.

Figure 35:
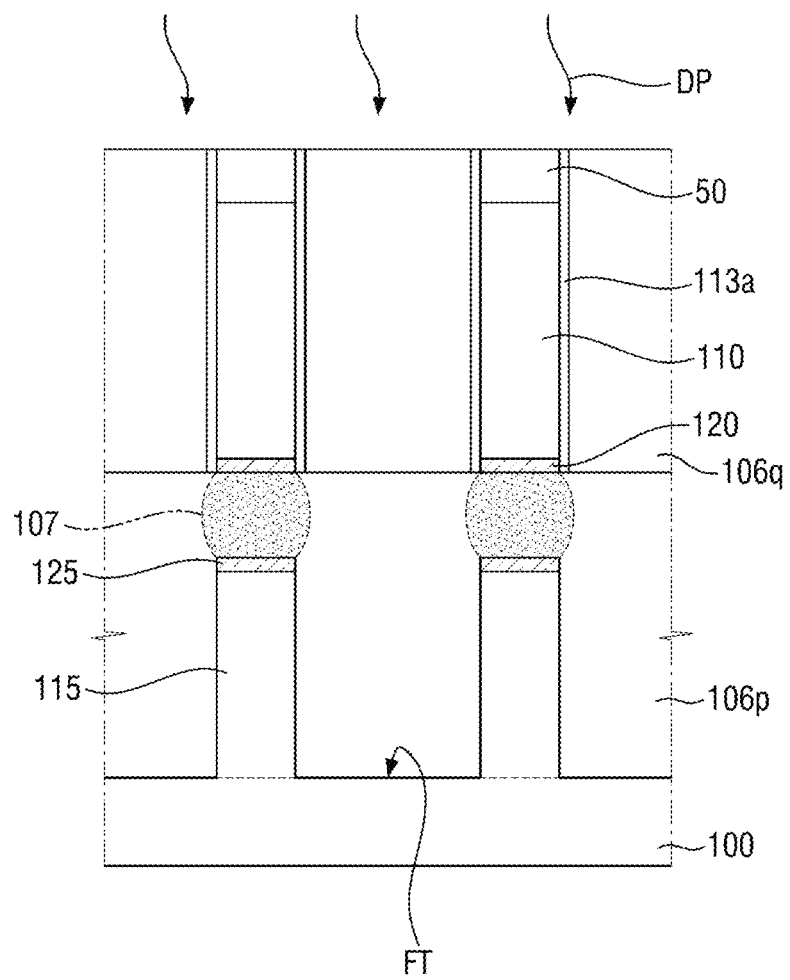

Referring to FIG. 35, the first filling insulating film 106p and the second filling insulating film 106q may be formed in the fin trench FT are formed in the fin trench FT through the densification process DP of the pre-lower filling film 106pa and the pre-upper filling film 106qa.

Each of the first filling insulating film 106p and the second filling insulating film 106q may be formed by densifying the pre-lower filling film 106pa and the pre-upper filling film 106qa.

While the densification process DP is performed, the sacrificial pattern 107p may be oxidized. The sacrificial pattern 107p may be oxidized to form a stress insulating film 107.

During the formation of the stress insulating film 107, the pre-fin liner film 113a may limit and/or prevent the first channel semiconductor pattern 110 from being oxidized.

Figure 36:
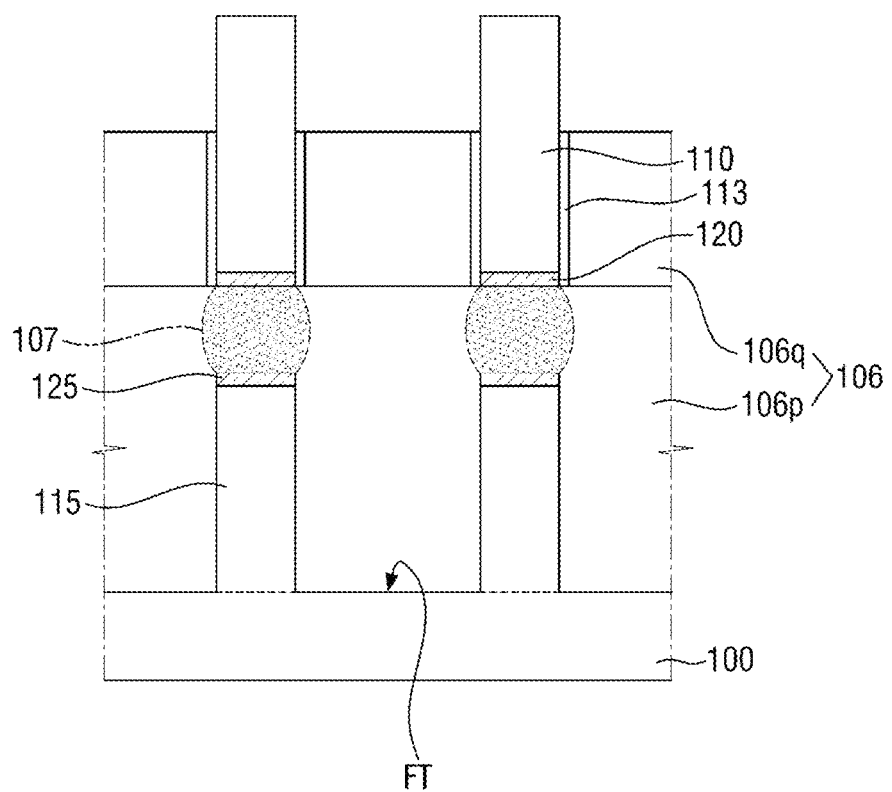

Referring to FIG. 36, a part of the second filling insulating film 106q and a part of the pre-fin liner film 113a are removed, and a part of the first channel semiconductor pattern 110 may protrude upward from the upper surface of the filling insulating film 106.

In concluding the detailed description, those skilled in the art will appreciate that many variations and modifications may be made to the presented embodiments without substantially departing from the principles of inventive concepts. Therefore, the disclosed presented embodiments of inventive concepts are used in a descriptive sense only and not for purposes of limitation.

What is claimed is:

1. A semiconductor device comprising:
   a substrate;
   a protruding pattern protruding from the substrate;
   a lower semiconductor pattern spaced apart from the protruding pattern in a first direction, and extending in a second direction intersecting the first direction;
   a plurality of upper semiconductor patterns spaced apart from the lower semiconductor pattern in the first direction;
   a gate electrode wrapping around the plurality of upper semiconductor patterns;
   a first antioxidant pattern extending along a bottom surface of the lower semiconductor pattern and spaced apart from the substrate in the first direction, the first antioxidant pattern including a first semiconductor material film doped with a first impurity; and
   a field insulating film on the substrate, the field insulating film covering at least a part of a side wall of the lower semiconductor pattern,
   wherein a portion of field insulating film is disposed between the first antioxidant pattern and the protruding pattern.

2. The semiconductor device of claim 1, wherein the field insulating film does not cover at least a part of a side wall of the plurality of upper semiconductor pattern.

3. The semiconductor device of claim 1, further comprising:
   a fin liner, wherein
   the fin liner extends along at least a part of the side wall of the lower semiconductor pattern, and
   the fin liner extends between the field insulating film and the lower semiconductor pattern.

4. The semiconductor device of claim 3, wherein the fin liner is not disposed on a side wall of the plurality of upper semiconductor patterns.

5. The semiconductor device of claim 1, wherein the first antioxidant pattern includes silicon, silicon germanium, or both silicon and silicon germanium.

6. The semiconductor device of claim 1, wherein the first impurity includes at least one of oxygen(O), nitrogen(N), and carbon(C).

7. The semiconductor device of claim 1, further comprising:
a second antioxidant pattern extending along an upper surface of the protruding pattern, wherein
the second antioxidant pattern is spaced apart from the first antioxidant pattern.

8. The semiconductor device of claim 1, wherein
the field insulating film includes a filling insulating film and a stress insulating film,
the stress insulating film includes an oxide containing germanium, and
the stress insulating film is between the first antioxidant pattern and the protruding pattern.

9. The semiconductor device of claim 1, the first antioxidant pattern includes a plurality of first sub-patterns and a plurality of second sub-patterns alternatively stacked,
the plurality of first sub-patterns are undoped, and
the plurality of second sub-patterns are doped.

10. A semiconductor device comprising:
a substrate;
a lower semiconductor pattern spaced apart from the substrate;
a plurality of upper semiconductor patterns spaced apart from the lower semiconductor pattern;
a gate electrode wrapping around the plurality of upper semiconductor patterns;
a field insulating film on the substrate and covering at least a part of a side wall of the lower semiconductor pattern, the field insulating film including a filling insulating film and a stress insulating film, the stress insulating film including an oxide containing germanium; and
a fin liner extending along at least a part of the side wall of the lower semiconductor pattern and extending between the field insulating film and the lower semiconductor pattern,
the fin liner being arranged so the fin liner is not in contact with the substrate.

11. The semiconductor device of claim 10, wherein the field insulating film does not cover at least a part of a side wall of the plurality of upper semiconductor patterns.

12. The semiconductor device of claim 10, wherein the fin liner is not disposed on a side wall of the plurality of upper semiconductor patterns.

13. The semiconductor device of claim 10, further comprising:
a protruding pattern protruding from the substrate, wherein
the field insulating film covers the protruding pattern, and
a height of a lower surface of the fin liner is higher than a height of an uppermost part of the protruding pattern relative to an upper surface of the substrate.

14. The semiconductor device of claim 10, wherein a height of a lower surface of the fin liner is the same as or lower than the height of a bottom surface of the lower semiconductor pattern relative to an upper surface of the substrate.

15. The semiconductor device of claim 10, wherein the fin liner includes a silicon nitride film.

16. The semiconductor device of claim 10, wherein the stress insulating film is between the lower semiconductor pattern and the substrate.

17. A semiconductor device comprising:
a substrate;
a protruding pattern protruding from the substrate;
a lower semiconductor pattern spaced apart from the protruding pattern in a first direction, and extending in a second direction intersecting the first direction;
a plurality of upper semiconductor patterns spaced apart from the lower semiconductor pattern in the first direction;
an antioxidant pattern contacting the lower semiconductor pattern and extending along a bottom surface of the lower semiconductor pattern, the antioxidant pattern extending between the protruding pattern and the lower semiconductor pattern, the antioxidant pattern including a first semiconductor material film undoped and a second semiconductor material film doped with a first impurity;
a field insulating film on the substrate, the field insulating film covering at least a part of a side wall of the lower semiconductor pattern,
a gate insulating film wrapping around the plurality of upper semiconductor patterns, and extending along an upper surface of the field insulating film in a third direction intersecting the first and the second direction;
a gate electrode extending in the third direction on the gate insulating film;
a capping pattern on the gate electrode; and
a fin liner extending along at least a part of a side wall of the lower semiconductor pattern between the field insulating film and the lower semiconductor pattern.

18. The semiconductor device of claim 17, wherein
the first semiconductor material film and the second semiconductor material film include silicon, and
the first impurity includes at least of one of oxygen(O), nitrogen(N), and carbon(C).

19. The semiconductor device of claim 17, wherein a height a lower surface of the fin liner is higher than a height of an uppermost part of the protruding pattern relative to an upper surface of the substrate.

20. The semiconductor device of claim 17, wherein the field insulating film includes a filling insulating film and a stress insulating film,
the stress insulating film includes an oxide containing germanium, and
the stress insulating film is between the antioxidant pattern and the protruding pattern.

* * * * *